United States Patent
Chen et al.

(10) Patent No.: US 11,424,205 B2
(45) Date of Patent: Aug. 23, 2022

(54) SEMICONDUCTOR INTERCONNECT STRUCTURE AND METHOD

(71) Applicant: Taiwan Semiconductor Manufacturing Company, Ltd., Hsinchu (TW)

(72) Inventors: Jie Chen, New Taipei (TW); Hsien-Wei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/417,846

(22) Filed: May 21, 2019

(65) Prior Publication Data
US 2020/0006266 A1    Jan. 2, 2020

Related U.S. Application Data

(60) Provisional application No. 62/692,444, filed on Jun. 29, 2018.

(51) Int. Cl.
*H01L 21/44* (2006.01)
*H01L 23/00* (2006.01)
*H01L 25/065* (2006.01)

(52) U.S. Cl.
CPC ............. *H01L 24/06* (2013.01); *H01L 24/03* (2013.01); *H01L 24/80* (2013.01);
(Continued)

(58) Field of Classification Search
CPC . H01L 24/06; H01L 24/03; H01L 2224/0612; H01L 2224/02372; H01L 2224/03614; H01L 2225/06572; H01L 2224/03616; H01L 24/80; H01L 2224/80194; H01L 25/0657; H01L 2224/03466; H01L 2924/3511;
(Continued)

(56) References Cited

U.S. PATENT DOCUMENTS

2004/0248372 A1* 12/2004 Tsau .................. H01L 28/60
438/396
2005/0250315 A1* 11/2005 Tran .................. A61P 31/04
438/637
(Continued)

FOREIGN PATENT DOCUMENTS

CN        102738040 A    10/2012
CN        103545324 A     1/2014
(Continued)

*Primary Examiner* — Ismail A Muse
(74) *Attorney, Agent, or Firm* — Slater Matsil, LLP

(57) ABSTRACT

A semiconductor device includes a first interconnect structure over first substrate, a first bonding layer over the first interconnect structure, multiple first bonding pads disposed in a first region of the first bonding layer, the first bonding pads having a first pitch, and multiple second bonding pads disposed in a second region of the first bonding layer, the second region extending between a first edge of the first bonding layer and the first region, the second bonding pads having the first pitch, the multiple second bonding pads
(Continued)

including multiple pairs of adjacent second bonding pads, wherein the second bonding pads of each respective pair are connected by a first metal line.

20 Claims, 27 Drawing Sheets

(52) U.S. Cl.
CPC .............. *H01L 25/0657* (2013.01); *H01L 2224/02372* (2013.01); *H01L 2224/03466* (2013.01); *H01L 2224/03614* (2013.01); *H01L 2224/03616* (2013.01); *H01L 2224/0612* (2013.01); *H01L 2224/80194* (2013.01); *H01L 2225/06572* (2013.01)

(58) Field of Classification Search
CPC ....... H01L 2224/80; H01L 2224/73251; H01L 24/09; H01L 2224/19; H01L 2224/20; H01L 2224/08147; H01L 2224/80948; H01L 2224/97; H01L 2224/80201; H01L 2224/80357; H01L 2224/05096; H01L 2224/80013; H01L 2224/80896; H01L 2224/80895; H01L 2224/05684; H01L 2224/03464; H01L 2224/05647; H01L 2224/05639; H01L 2224/05644; H01L 2224/05657; H01L 2224/05624; H01L 2224/05555; H01L 2224/05552; H01L 2224/06131; H01L 2224/06051; H01L 2224/0603; H01L 23/5283; H01L 2224/08121; H01L 2224/02375; H01L 24/08; H01L 24/05; H01L 25/16; H01L 25/18; H01L 25/50; H01L 25/04; H01L 24/02; H01L 2224/80143; H01L 2224/8034

See application file for complete search history.

(56) References Cited

U.S. PATENT DOCUMENTS

| | | | |
|---|---|---|---|
| 2007/0132059 A1* | 6/2007 | Tsai | H01L 23/5258 257/530 |
| 2007/0155091 A1* | 7/2007 | Park | H01L 23/5223 438/253 |
| 2010/0109106 A1* | 5/2010 | Zhong | H01L 27/228 257/421 |
| 2011/0101478 A1* | 5/2011 | Zhong | H01L 27/228 257/421 |
| 2011/0129946 A1* | 6/2011 | Zhong | H01L 27/228 438/3 |
| 2011/0263120 A1* | 10/2011 | Kuo | H01L 21/76898 438/667 |
| 2012/0256323 A1 | 10/2012 | Engelhardt et al. | |
| 2013/0015743 A1* | 1/2013 | Tsai | B81B 3/0005 310/300 |
| 2014/0015084 A1 | 1/2014 | Chen et al. | |
| 2014/0264679 A1* | 9/2014 | Lee | H01L 43/08 257/427 |
| 2014/0264883 A1 | 9/2014 | Tsai et al. | |
| 2015/0194455 A1* | 7/2015 | Ho | H01L 25/50 257/460 |
| 2015/0236064 A1 | 8/2015 | Chen et al. | |
| 2016/0086869 A1 | 3/2016 | Ahn et al. | |
| 2017/0040372 A1 | 2/2017 | Ho et al. | |
| 2017/0117316 A1 | 4/2017 | Hsu et al. | |
| 2017/0345771 A1* | 11/2017 | Hu | H01L 23/552 |
| 2019/0252444 A1* | 8/2019 | Ryoki | H01L 27/14607 |

FOREIGN PATENT DOCUMENTS

| | | |
|---|---|---|
| CN | 104051422 A | 9/2014 |
| CN | 106449672 A | 2/2017 |
| CN | 106611755 A | 5/2017 |
| KR | 20140008983 A | 1/2014 |

* cited by examiner

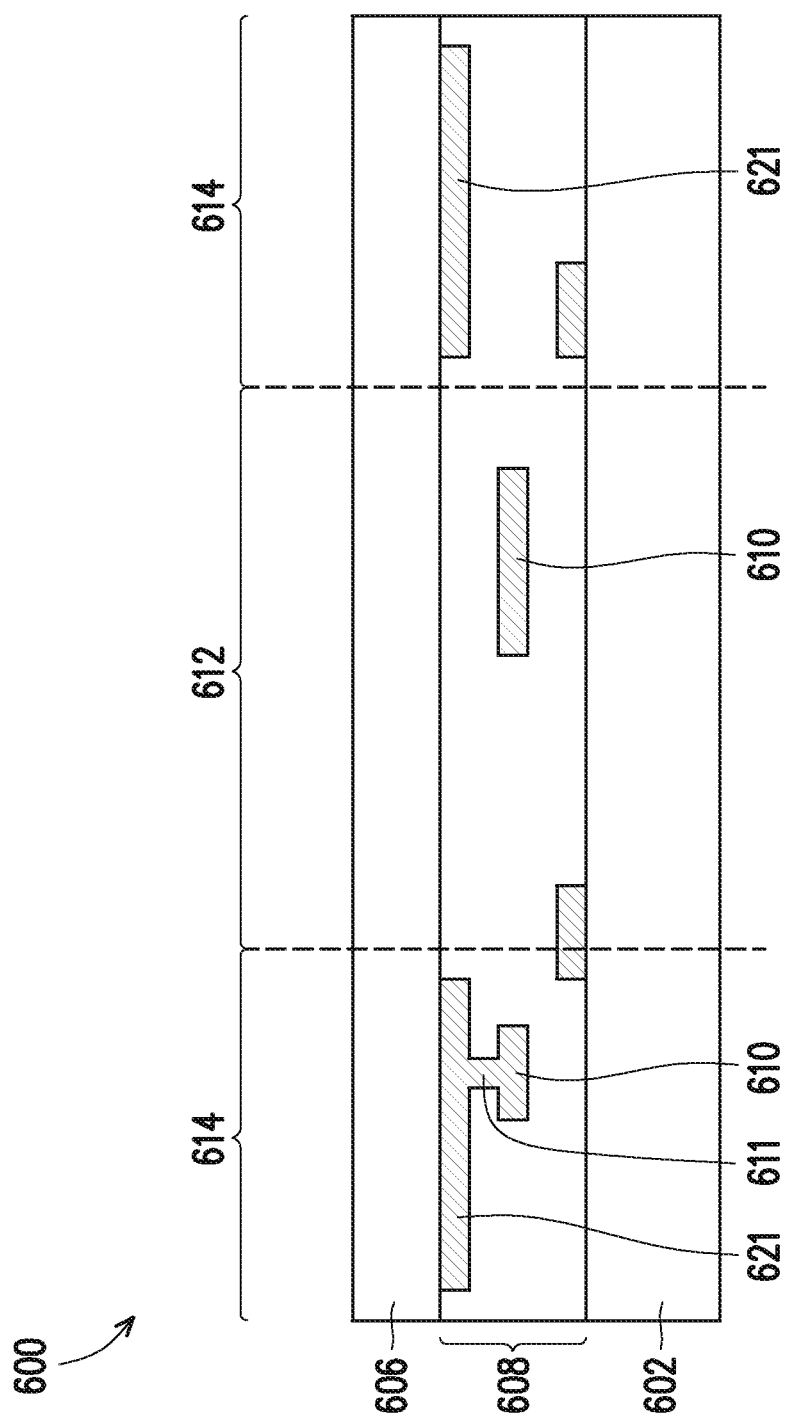

SEMICONDUCTOR INTERCONNECT STRUCTURE AND METHOD

PRIORITY

This application claims the benefit to U.S. Provisional Patent Application No. 62/692,444 filed Jun. 29, 2018, and entitled "Semiconductor Interconnect Structure and Method," which application is incorporated herein by reference.

BACKGROUND

In wafer-to-wafer bonding technology, various methods have been developed to bond two package components (such as wafers) together. Some wafer bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-E illustrate cross-sectional views of intermediate steps in a process for forming bonding structures in a semiconductor device in accordance with some embodiments.

DETAILED DESCRIPTION

Figure 1A:
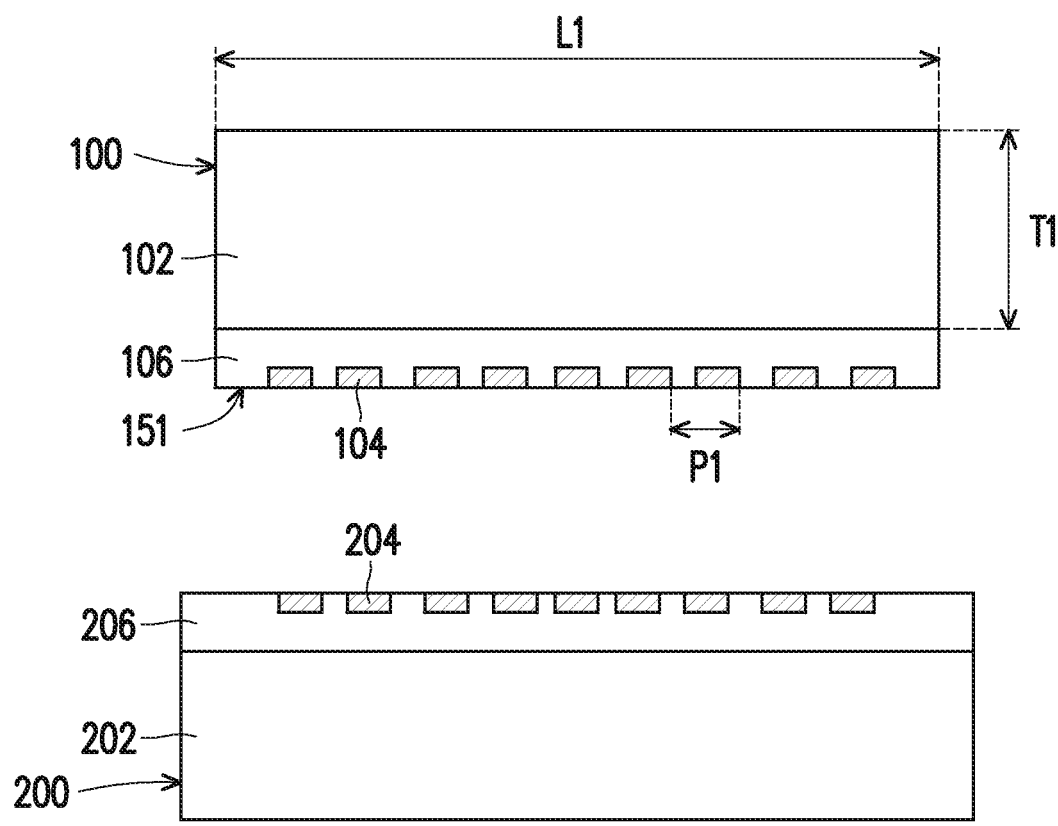
FIGS. 1A-B illustrate cross-sectional views of intermediate steps in a process for forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
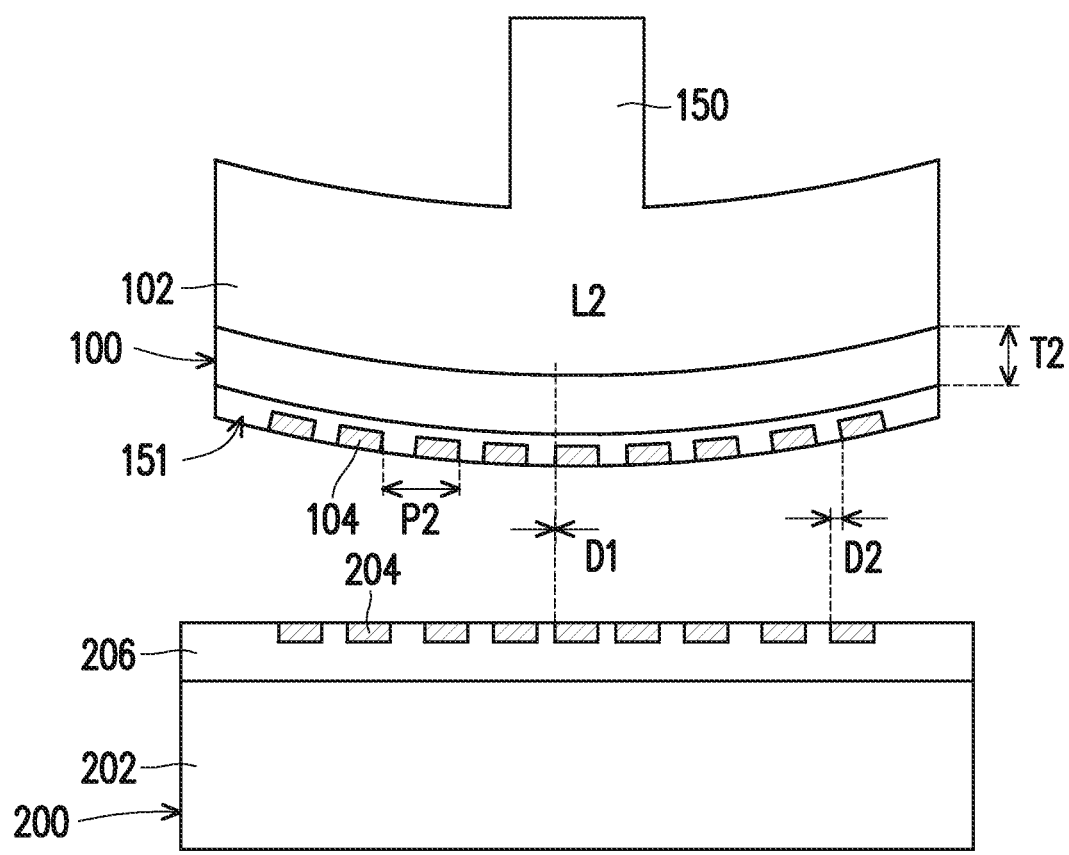

FIGS. 1A-B illustrates an example semiconductor device 100 and an example wafer 200 according to some embodiments. The semiconductor device 100 and the wafer 200 may be subsequently bonded together, for example, using a pick-and-place process or to form part of a packaged device. Semiconductor device 100 includes a substrate 102 and features formed over the substrate 102. The substrate 102 may be a semiconductor substrate, such as a bulk semiconductor, a semiconductor-on-insulator (SOI) substrate, or the like, which may be doped (e.g., with a p-type or an n-type dopant) or undoped. Generally, a SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. As shown in FIG. 1A, the substrate 102 may have a thickness T1 between about 100 µm and about 800 µm, and may have a dimension (i.e., length or width) L1 between about 5000 µm and about 60000 µm.

In some embodiments, the semiconductor device 100 may be a semiconductor device such as a memory device, a logic device, a power device, combinations of these, or the like, that is designed to work in conjunction with other devices within a package, including devices or structures within the wafer 200. However, any suitable functionality may be utilized. In some embodiments, integrated circuit devices are formed on the top surface of the substrate 102. Integrated circuit devices may include complementary metal-oxide semiconductor (CMOS) transistors, resistors, capacitors, diodes, or the like. The details of the integrated circuit devices are not illustrated herein. In some embodiments, the semiconductor device 100 is used for forming interposers. In such embodiments, no active devices such as transistors or diodes are formed on the substrate 102. There may (or may not) be passive devices such as capacitors, resistors, inductors, or the like formed in the semiconductor device 100. The substrate 102 may also be a dielectric substrate in the embodiments in which the semiconductor device 100 is an interposer. Furthermore, through-vias (not shown) may be formed to penetrate through the substrate 102 in order to interconnect components on the opposite sides of the substrate 102.

The semiconductor device 100 also includes multiple bonding pads 104 disposed within a bonding layer 106 formed on a side of the substrate 102. The bonding pads 104 may be formed from a conductive material, and may be electrically connected to integrated circuit devices, metal lines, interconnects, through-vias, or other features within the semiconductor device 100. In some cases, one or more metallization layers (not shown) may be disposed between the substrate 102 and the bonding layer 106. In some embodiments, the bonding pads 104 may have an initial (i.e., prior to bonding or being mounted to a bond head) pitch P1 between about 5 μm and about 25 μm. In some embodiments, bonding pads may be disposed on both sides of the substrate 102.

The wafer 200 includes a substrate 202, a dielectric layer 206, and bonding pads 204. The substrate 202 may be similar to substrate 102 of semiconductor device 100 as described above, or may be different than substrate 102. The dielectric layer 206 or the bonding pads 204 may be similar to the surface bonding layer 106 or bonding pads 104 of semiconductor device 100, respectively, or may be different. The bonding pads 204 of the wafer 200 may correspond to bonding pads 104 of the semiconductor device 100. For example, after bonding the semiconductor device 100 to the wafer 200, corresponding bonding pads 104 and bonding pads 204 may make electrical connections between the semiconductor device 100 and the wafer 200.

FIG. 1B shows the semiconductor device 100 shown in FIG. 1A after having been thinned (e.g., by a chemical mechanical polishing (CMP) process) and mounted to a bond head 150. For example, the bond head 150 may be used to bond the semiconductor 100 to the wafer 200 as part of a pick-and-place process. In some cases, semiconductor device 100 may be thinned to a thickness T2 between about 7 μm and about 100 μm before being mounted to the bond head 150. In some cases, mounting the semiconductor device 100 to the bond head 150 may cause the semiconductor device 100 to warp into a curved shape, as shown in FIG. 1B. As an illustrative example, in FIG. 1A, the outer surface 151 of the bonding layer 106 has a relatively level shape, but in FIG. 1B, the outer surface 151 of the bonding layer 106 has a curved shape. In some embodiments, the bond head 150 is configured to produce warping of the semiconductor device 100.

Figure 3A:
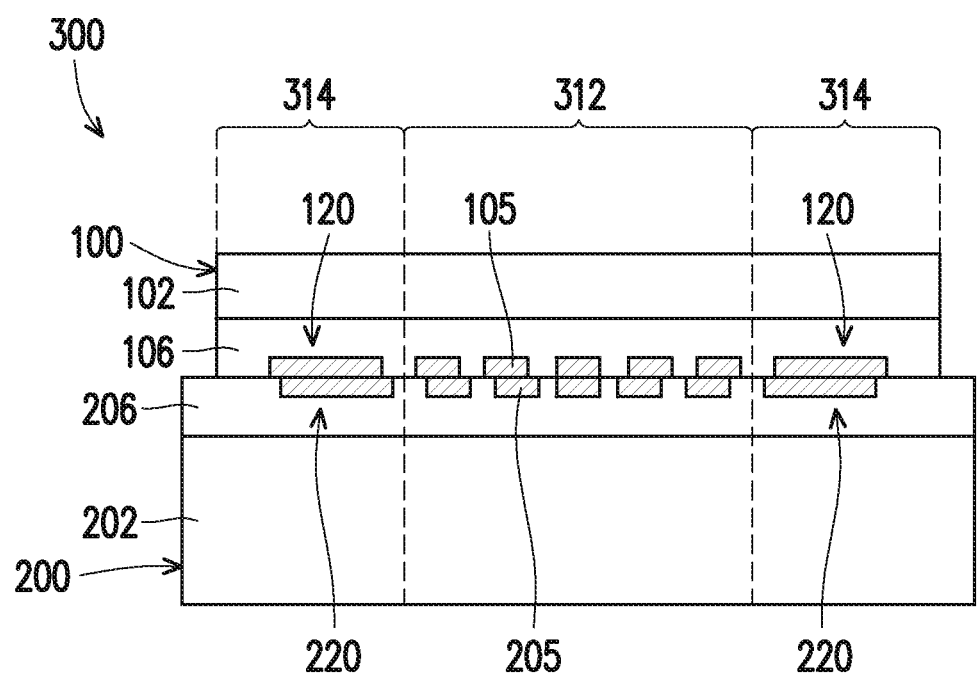
FIGS. 3A-E illustrate cross-sectional views and plan views of a semiconductor device with bonding structures in accordance with some embodiments.

In some cases, the warping of the semiconductor device 100 causes the outer surface 151 of the bonding layer 106 to expand, which may also increase the pitch of some or all of the bonding pads 104. For example, due to the warping of the semiconductor device 100 when mounted to the bond head 150 (shown in FIG. 1B), the bonding pads 104 may have a warped pitch P2 that is greater than the initial pitch P1 of the unmounted semiconductor device 100 (shown in FIG. 1A). In some cases, some regions of a warped semiconductor device 100 may have a different pitch than other regions of the semiconductor device 100. For example, regions closer to the edges of a warped semiconductor device 100 may have a greater pitch than regions closer to the center. For cases in which the pitch of bonding pads 104 has increased from the initial pitch P1 to the warped pitch P2, some or all of the bonding pads 104 of the semiconductor device 100 may not align as accurately with corresponding bonding pads 204 of the wafer 202. In some cases, the misalignment between corresponding bonding pads can cause increased resistance or open connections. This misalignment may be more pronounced closer to the edges of the semiconductor device 100. For example, as shown in FIG. 1B, the misalignment D1 between corresponding bonding pads near the center of the semiconductor device 100 is less than the misalignment D2 between corresponding bonding pads near the edge of the semiconductor device 100. In some cases, warping of the semiconductor device 100 may cause a misalignment between corresponding bonding pads as much as about 3000 nm. In some cases, a misalignment of corresponding bond pads prior to bonding (FIG. 1B, for example) may be different than the misalignment after bonding (FIG. 3A, for example).

Figure 2A:
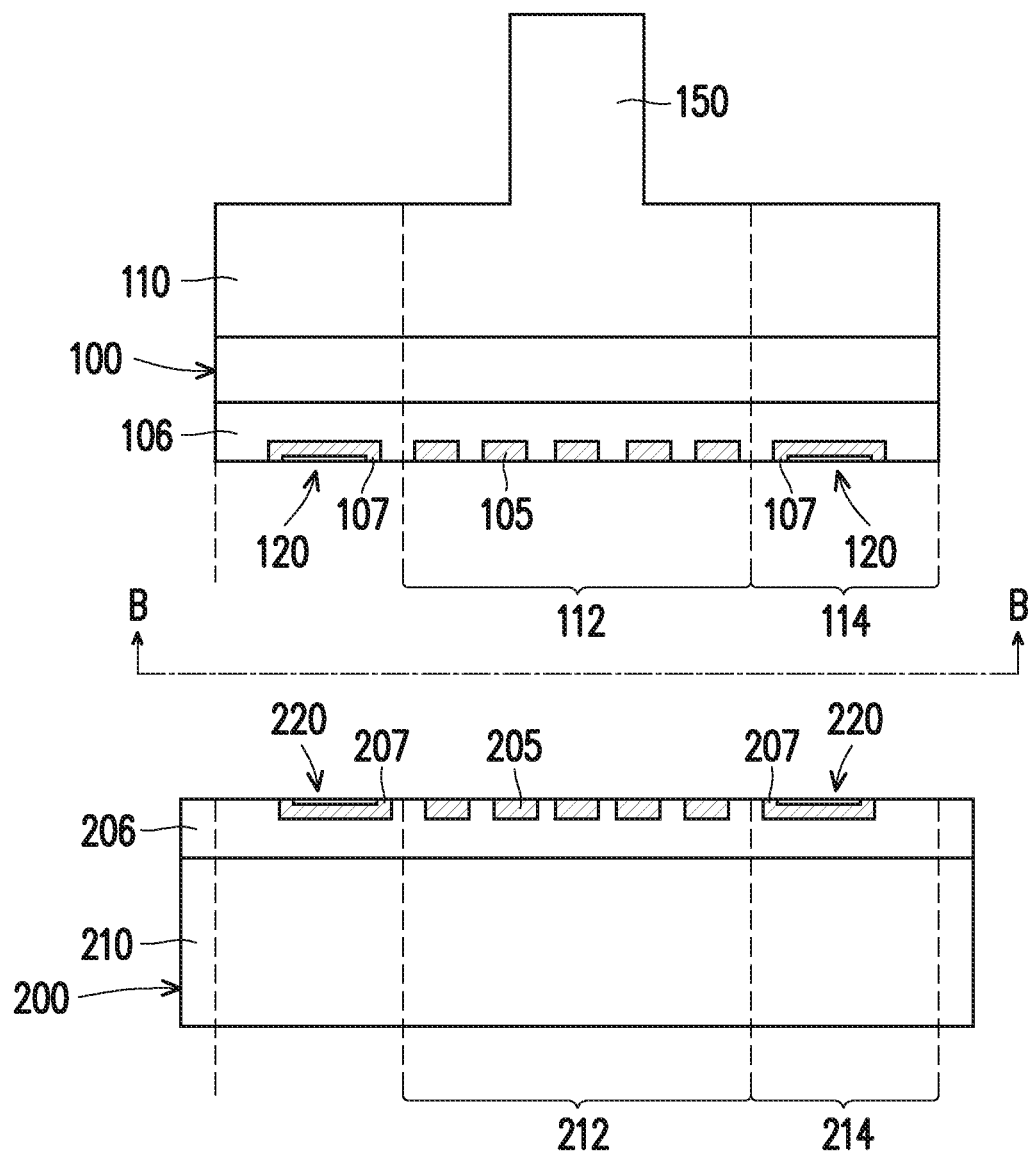
FIGS. 2A-B illustrate a cross-sectional view and a plan view of intermediate steps in a process for forming another package structure in accordance with some embodiments.
Figure 2B:
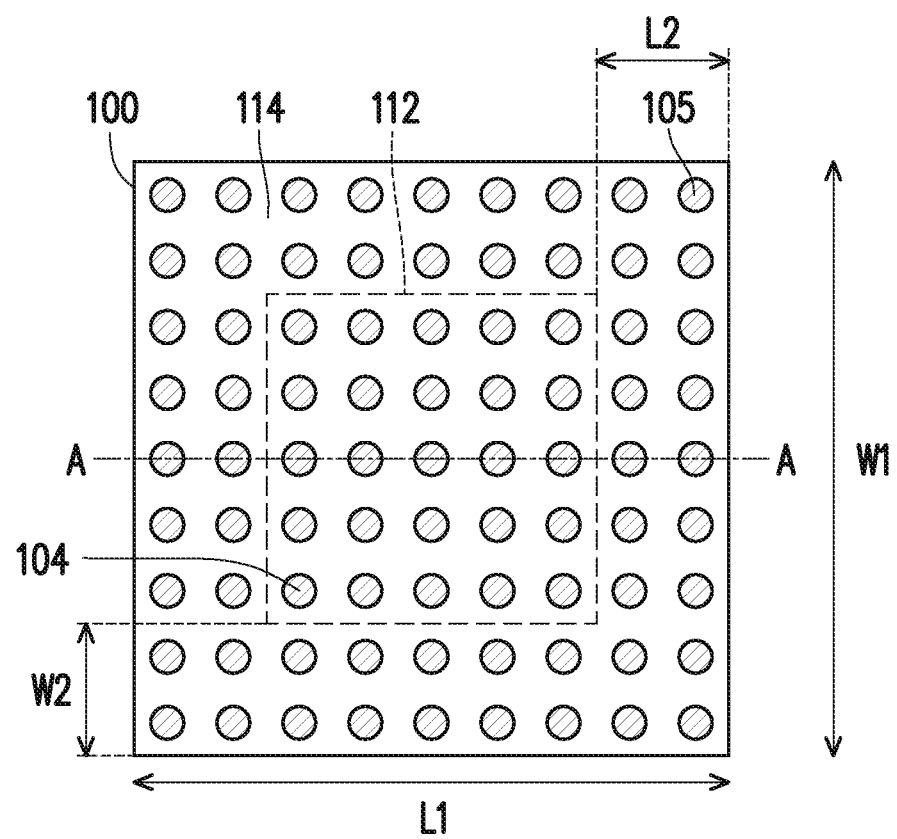

Turning to FIGS. 2A-B, a semiconductor device 100 and a wafer 200 are shown according to some embodiments. The semiconductor device 100 and the wafer 200 may be similar to those described above with respect to FIGS. 1A-B. In FIG. 2A, the semiconductor device 100 is shown as mounted to a bond head 150, though for clarity the warping of the semiconductor device 100 is not shown. FIG. 2B shows a plan view of the semiconductor device 100, as indicated by view B-B shown in FIG. 2A. FIG. 2A shows a cross-sectional view through cross-section A-A as shown in FIG. 2B. FIGS. 2A-B shows the pitch of bonding pads of the semiconductor device 100 has increased due to warping of the semiconductor device 100, as described previously.

In some embodiments, the semiconductor device 100 includes an inner region 112 that includes inner bonding pads 105 and an outer region 114 that includes bonding structures 120. In some embodiments, the bonding structures 120 each include two or more outer bonding pads 107 that are electrically connected together by parallel connections, described in greater detail below. By connecting multiple outer bonding pads 107 in the outer region 114, resistive effects due to bonding misalignment (such as described above with respect to FIG. 1B) may be reduced. The inner bonding pads 105 and/or the outer bonding pads 107 may be similar to the bonding pads 104 described previously. In some embodiments, the bonding structures 120 or outer bonding pads 107 in the outer region 114 may have an initial pitch (in one or both perpendicular directions) that is about the same as the initial pitch (in one or both perpendicular directions) of the inner bonding pads 105 in the inner region 112. In some embodiments, the outer region 114 or the inner region 112 may include both inner bonding pads 105 and outer bonding pads 107. In some embodiments, the wafer 200 may also include an inner region 212 with inner bonding pads 205 and an outer region 214 with outer bonding structures 220 and outer bonding pads 207. The inner region 212, inner bonding pads 205, outer region 214, or outer bonding structures 220 may be similar to corresponding features described with respect to the semiconductor device 100.

The semiconductor device 100 shown in FIG. 2B has a total width of W1 and a total length of L1. As an illustrative example, the outer region 114 is shown as the region extending a width W2 and a length L2 inward from the edges of the semiconductor device 100. In some embodiments, the width W2 or length L2 of the outer region 114 may be defined as fractions of the total width W1 or total length L1, respectively. For example, the width W2 or length L2 may be defined as between about 5% and about 20%, such as less than about 10% of the total width W1 or total length L1, respectively. For example, the width W2 may be about 10% of the total width W1, though other fractional values may be used. The width W2 may be the same fraction of the total width W1 as the length L2's fraction of the total length L1, or the width W2 may be a different fractional value than the length L2. In some cases, the distance or fractional value of the width W2 or length L2 may be determined based on the amount of expected expansion or the amount of expected misalignment. For example, in some cases, problems due to misalignment such as increased resistance may be most severe within a width W2 that is about 10% of the total width W1, though other distances or fractional values may be used in other cases. The outer region 114 may also extend different distances from opposite or adjacent edges of the semiconductor device 100.

FIG. 2B shows that the outer region 114 includes two rows of outer bonding pads 107 (within width W2) and two columns of outer bonding pads 107 (within length L2), but other embodiments may have one row or more than two rows of outer bonding pads 107 within width W2 or may have one column or more than two columns of outer bonding pads 107 within length L4. In some cases, the width W2 or the length L2 may be defined in terms of numbers of rows or columns of outer bonding pads 107, or in terms of multiples of initial pitch. In some cases, the size of the outer region 114 is determined from the warping of the semiconductor device 100 due to being mounted to a bond head 15o. In some embodiments, the border between the inner region 112 and the outer region 114 may have a shape other than a rectangular shape, such as a cross-shape, an elliptical shape, etc.

Turning to FIGS. 3A-E, a bonded semiconductor structure 300 is shown according to some embodiments. In the embodiments shown in FIGS. 3A-E, the parallel connections between electrically connected outer bonding pads of the outer bonding structures are formed in the same layer as the outer bonding pads. The bonded semiconductor structure 300 includes a semiconductor device 100 bonded to a wafer 200. The semiconductor device 100 and the wafer 200 may be similar to those described above with respect to FIGS. 2A-B. The bonded semiconductor structure 300 includes an inner region 312 and an outer region 314, which may be similar to the inner region 112 or outer region 114 described previously. In the inner region 312, the semiconductor device 100 and the wafer 200 are electrically connected by the inner bonding pads 105 of the semiconductor device 100 and the inner bonding pads 205 of the wafer 200. In the outer region 314, the semiconductor device 100 and the wafer 200 are electrically connected by the outer bonding structures 120 of the semiconductor device 100 and the outer bonding structures 220 of the wafer 200. FIG. 3A shows a cross-sectional view of the bonded semiconductor structure 300. FIGS. 3B-3E show plan views of example embodiments of the bonded semiconductor structures 300 including a portion of the inner region 312 with example inner bonding pads 105 and inner bonding pads 205 and including a portion of the outer region 314 with example outer bonding structures 120 and outer bonding structures 220. FIGS. 3A-E show the semiconductor device 100 and the wafer 200 as having a misalignment after bonding due to warping of the semiconductor device 100, as described previously.

Figure 3B:
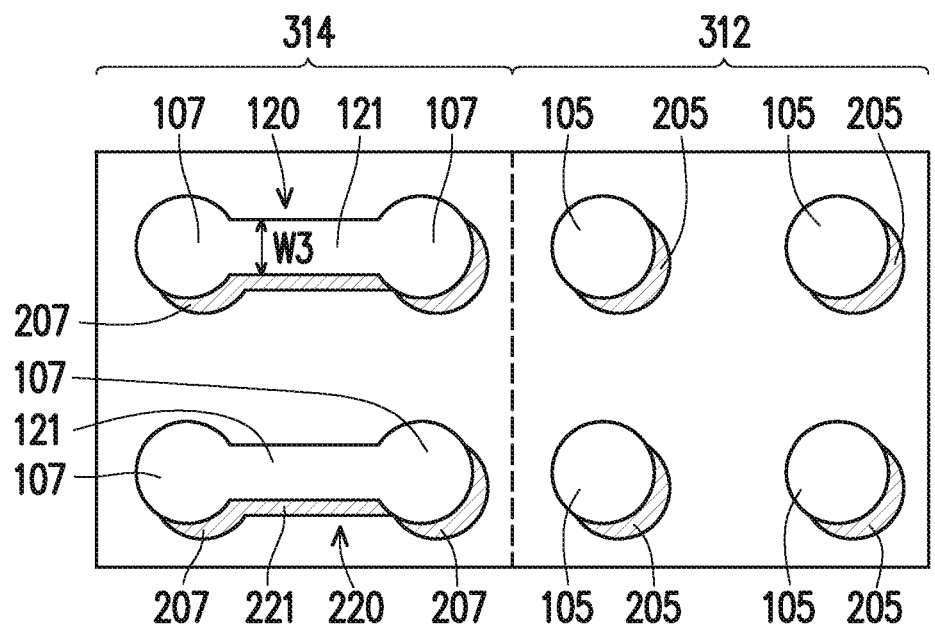

As shown in FIGS. 3B-E, the outer bonding structure 120 of the semiconductor device 100 includes two outer bonding pads 107 connected by one or more parallel connections 121, and the outer bonding structure 220 of the wafer 200 includes two outer bonding pads 207 connected by one or more parallel connections 221. As shown in FIGS. 3A-E, the parallel connections 121 may be disposed in the same layer as the outer bonding pads 107, and the parallel connections 221 may be disposed in the same layer as the outer bonding pads 207. In some embodiments, the parallel connections 121 (or 221) are metal lines connecting adjacent pairs of outer bonding pads 107 (or 207) The outer bonding pads 107 may have the same initial pitch as the inner bonding pads 105, and the outer bonding pads 207 may have the same initial pitch as the inner bonding pads 205. The parallel connections 121 (or 221) may have a width W3 that is less than, about equal to, or greater than a dimension of the outer bonding pads 107 (or 207). For example, FIG. 3B shows parallel connections 121 having a width W3 less than a diameter of the outer bonding pads 107. In some embodiments, parallel connections 121 (or 221) may have a width W3 between about 500 nm and about 3500 nm. FIG. 3B shows parallel connections 121 (and parallel connections 221) as having a rectangular shape, but in other embodiments, parallel connections 121 (or 221) may have more than one width W3 along their length or have a different shape such as a curved shape, a trapezoidal shape, a shape with one or more tapering portions, an irregular shape, or another shape.

In the embodiments shown in FIG. 3A-E, both the outer bonding pads 107 and the parallel connections 121 are disposed in an outer layer of the bonding layer 106. Top surfaces of the outer bonding pads 107 and the parallel connection 121 are substantially coplanar and include portions not covered by the bonding layer 106. In this manner, the outer bonding pads 107 and the parallel connection 121 may both be used for the outer bonding structure 120 to form electrical connections when the semiconductor device 100 is bonded to the wafer 200. For example, the outer bonding structures 220 of the wafer 200 may include outer bonding pads 207 and parallel connections 221 disposed in an outer layer of the dielectric layer 206 to make electrical connection with the outer bonding structure 120. In some embodiments, an outer bonding structure 120 of the semiconductor device 100 is bonded to a corresponding bonding feature of the wafer 200 (such as an outer bonding structure 220, bonding pad(s), or other type of feature) to form an electrical connection. By using surfaces of the parallel connections 121 (or 221) in addition to surfaces of multiple outer bonding pads 107 (or 207) for some bonded electrical connections between the semiconductor device 100 and the wafer 200, the overlapping contact area of the bonded electrical connections may be increased, which may reduce contact resistance of the bonded electrical connections. Additionally, the increased area of the outer bonding structures 120 (or 220) may allow for increased overlapping contact area if a misalignment is present, such as the example misalignments shown in FIGS. 3A-3E. In this manner, contact resistance of the bonded electrical connections due to misalignment may be reduced near the edges of the semiconductor device 100, where the misalignment may be more pronounced.

Figure 3C:
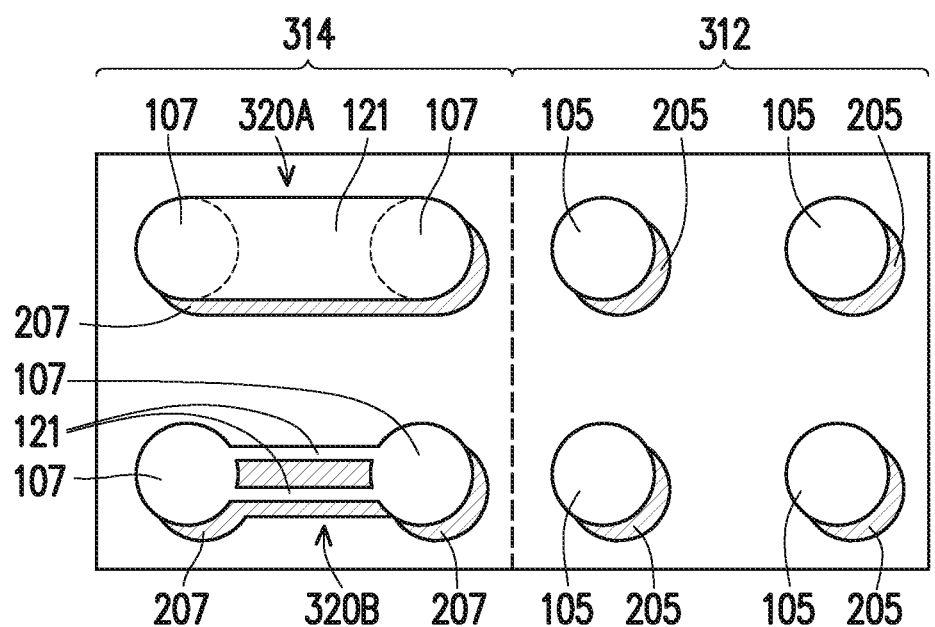
Figure 3D:
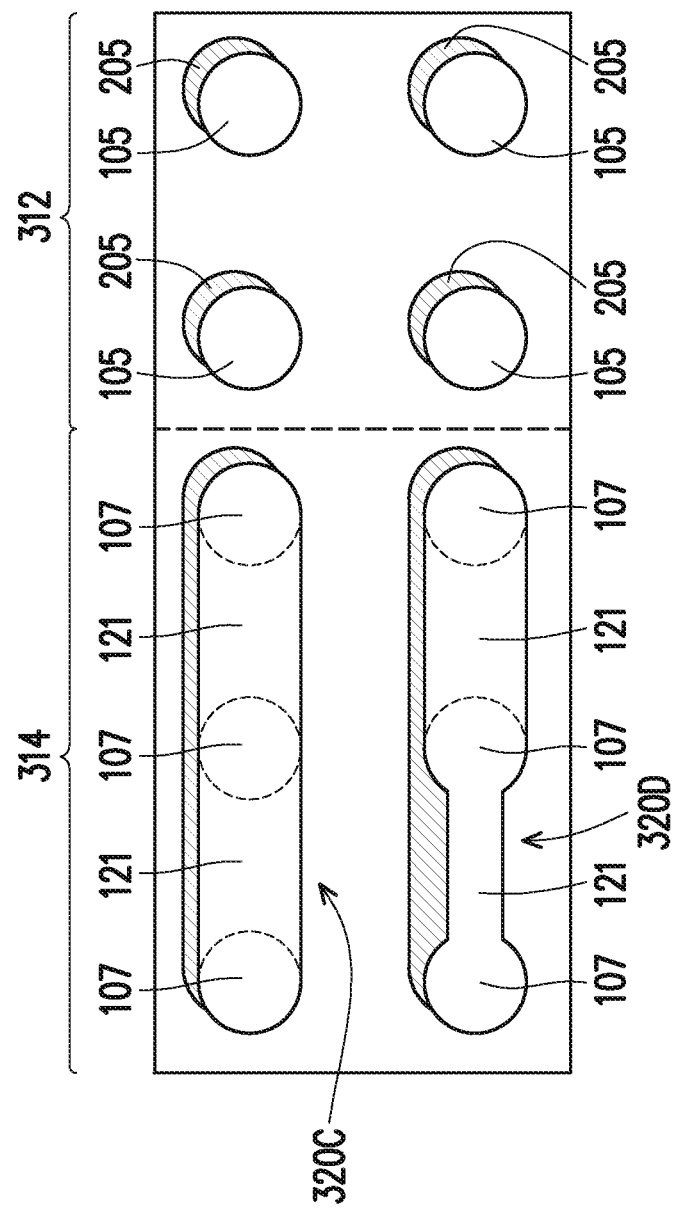
Figure 3E:
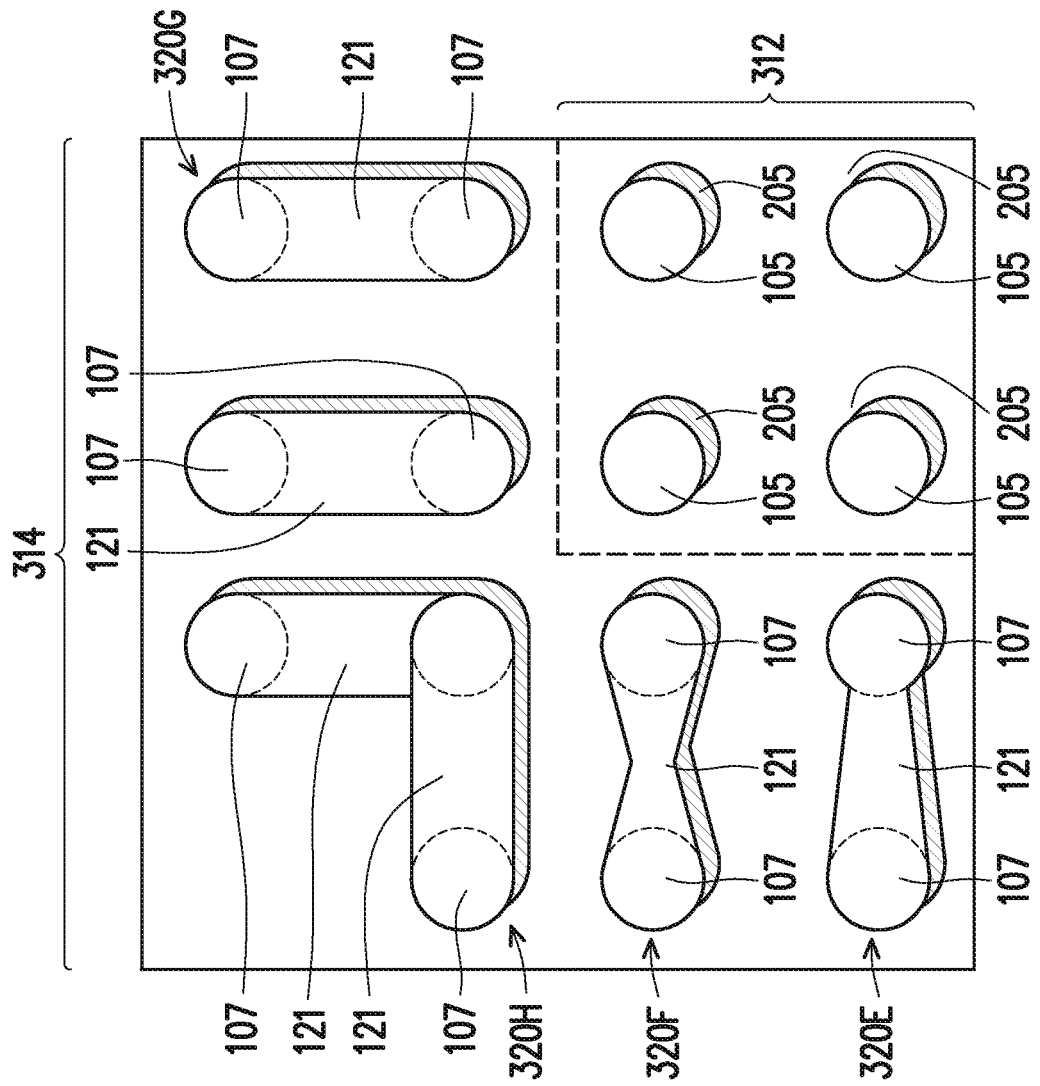

FIGS. 3C-E show additional example embodiments of outer bonding structures. The outer bonding structures 320A-H of the semiconductor device 100 may be similar to the outer bonding structures 120 described previously. For clarity, outer bonding structures of the wafer 200 are not labeled, but may be similar to outer bonding structures 120 or 320A-H. In some embodiments, outer bonding structures 120 on the semiconductor device 100 may have a different configuration than the corresponding outer bonding structures 220 on the wafer 200 to which they are bonded. The embodiments shown in FIGS. 3B-E are non-limiting and illustrative examples, and other configurations, arrangements, or combinations of features not shown are intended to be within the scope of this disclosure.

FIG. 3C shows an example outer bonding structure 320A and an example outer bonding structure 320B. The outer bonding structure 320A is similar to outer bonding structure 120, except that the width of the parallel connection 121 is about the same as the diameters of the outer bonding pads 107. The outer bonding structure 320B is similar to outer bonding structure 120, except that the adjacent outer bonding pads 107 are connected by two parallel connections 121. FIG. 3D shows an outer bonding structure 320C and an outer bonding structure 320D. Outer bonding structure 320C includes three outer bonding pads 107 that are electrically connected together, with a parallel connection 121 extending between each pair of adjacent outer bonding pads 107. Outer bonding structure 320D is similar to outer bonding structure 320C except that the parallel connections 121 between adjacent outer bonding pads 107 have different widths. In other embodiments, parallel connections 121 connecting multiple outer bonding pads 107 may have different shapes, or different numbers of parallel connections 121 may extend between different connected pairs of adjacent outer bonding pads 107.

FIG. 3E shows a corner of an outer region 314 including example outer bonding structures 320E-H. For example, the corner of the outer region 314 may be near a corner of the semiconductor device 100. The outer bonding structure 320E includes a parallel connection 121 that has a tapering shape, in which the parallel connection has a larger width at one outer bonding pad 107 than the opposite outer bonding pad 107. The outer bonding structure 320F includes a parallel connection 121 that has a tapering shape in which the center of the parallel connection 121 has a smaller width than either end of the parallel connection 121. These are examples, and other shapes of parallel connections 121 with tapering portions or portions with different widths are possible. The outer bonding structure 320G is similar to other outer bonding structures described, except that the connected outer bonding pads 107 are disposed along a first edge and are oriented perpendicularly to connected outer bonding pads 107 disposed along a second edge (e.g., in outer bonding structures 320E-F). In this manner, the outer bonding pads 107 may be connected in different orientations on the same device. For example, the orientation of each pair of connected outer bonding pads 107 may be determined from the expected warping of the semiconductor device 100 after being mounted to a bond head 150. In some cases, the connected outer bonding pads 107 of a device may all have the same orientation. The outer bonding structure 320H includes three outer bonding pads 107 that are connected by parallel connections 121 having two different orientations. In some cases, having the outer bonding pads 107 connected in different orientations may help improve electrical connections if the misalignment is along more than one direction.

FIGS. 4A-D illustrate cross-sectional views of intermediate stages in the formation of bonding structures in a semiconductor device 400, in accordance with some embodiments. The semiconductor device 400 may be similar to the semiconductor device 100 or wafer 200 described previously. As shown in FIGS. 4A-D, the semiconductor device 400 may have an inner region 412 and an outer region 414, which may be similar to the inner region 112 and the outer region 114 described previously. The semiconductor device 400 includes a substrate 402 on which an optional interconnect structure 408 may be formed. The substrate 402 may be similar to the substrate 102 described previously. The interconnect structure 408 may include one or more layers, such as inter-layer dielectric (ILD) layers, that are electrically connected to features present in the substrate 402 such as active devices, passive devices, conductive lines, etc. The interconnect structure 408 may include conductive features such as metal lines 410 or vias 411.

The interconnect structure 408 may be formed from one or more layers of one or more dielectric materials. In some embodiments, layers of the interconnect structure 408 are formed from a low-k dielectric material having a k-value lower than about 3.0 or an extra-low-k (ELK) dielectric material having a k-value of less than about 2.5. In some embodiments, layers of the interconnect structure 408 are formed of silicon oxide, silicon nitride, silicon carbide (SiC), silicon carbo-nitride (SiCN), silicon oxy-carbo-nitride (SiOCN), or the like. In some embodiments, the interconnect structure 408 may include other layers such as etch stop layers or diffusion barrier layers (not shown).

The metal lines 410 or the vias 411 of the interconnect structure 408 may be formed using a single and/or a dual damascene process, a via-first process, a metal-first process, or another process. In some embodiments, a layer of the interconnect structure is formed, and openings are formed therein using acceptable photolithography and etching techniques. Diffusion barrier layers (not shown) may be formed in the openings and may include a material such as TaN, Ta, TiN, Ti, CoW, or the like, and may be formed in the openings by a deposition process such as CVD, ALD, or the like. A conductive material may be formed in the openings from copper, aluminum, nickel, tungsten, cobalt, silver, combinations thereof, or the like, and may be formed over the diffusion barrier layers in the openings by an electro-chemical plating process, CVD, ALD, PVD, the like, or a combination thereof. After formation of the diffusion barrier layers and the conductive material, excess of the diffusion barrier layers and conductive material may be removed by, for example, a planarization process such as CMP, thereby leaving metal lines 410 in the openings of the layer. The process may then be repeated to form multiple layers of the interconnect structure 408 and metal lines 410 and vias 411 therein.

Figure 4A:
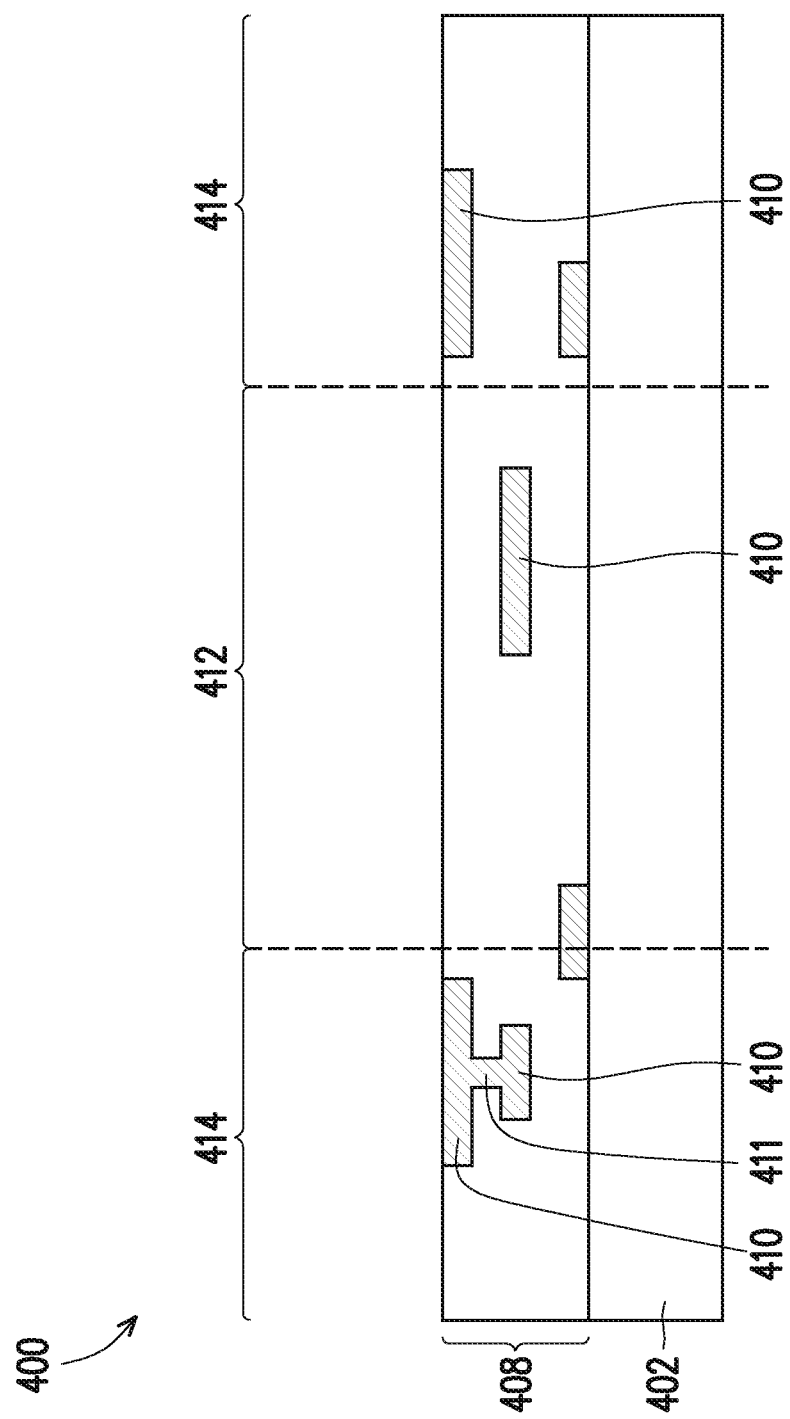
FIGS. 4A-D illustrate cross-sectional views of intermediate steps in a process for forming bonding structures in a semiconductor device in accordance with some embodiments.
Figure 4B:
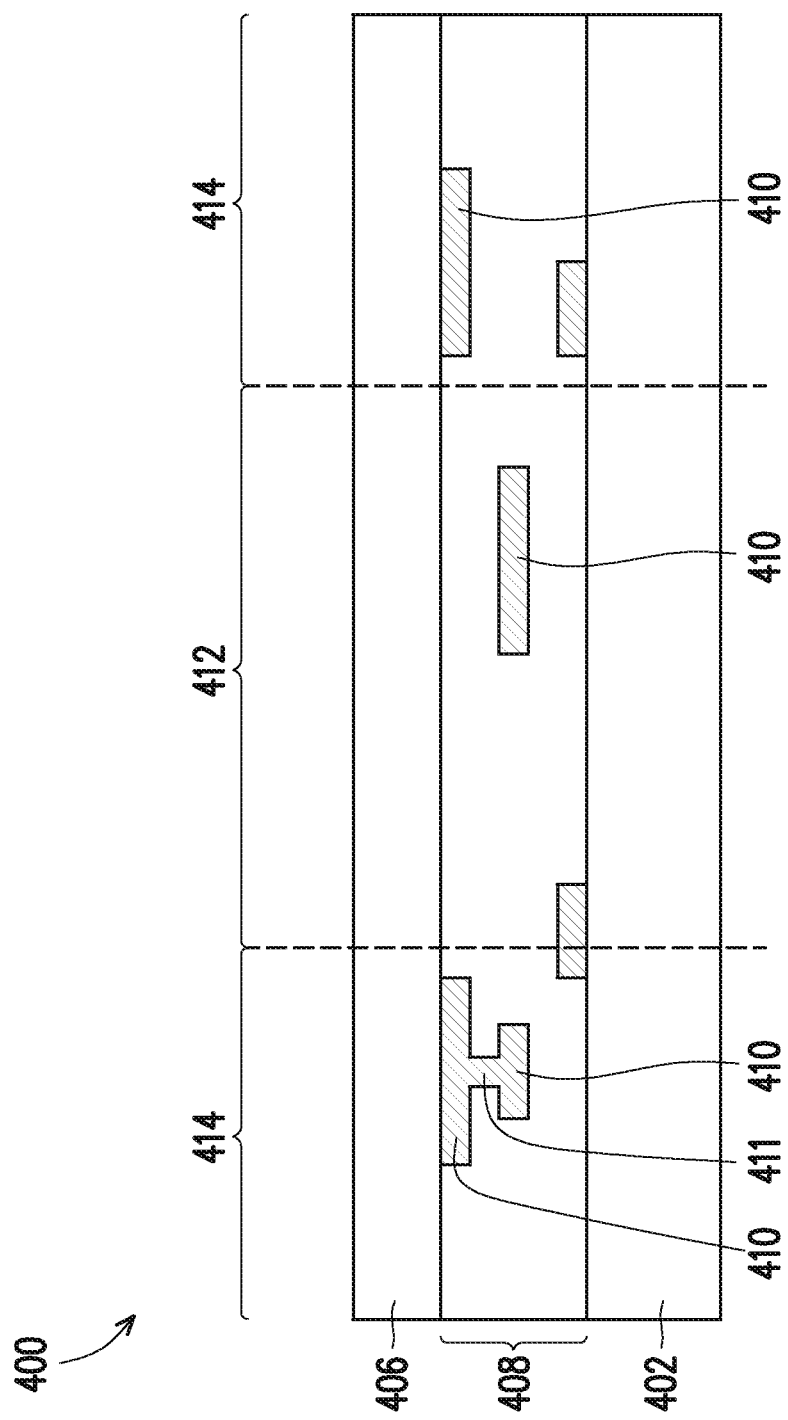

Turning to FIG. 4B, a bonding layer 406 is formed over the interconnect structure 408. The bonding layer 406 may be similar to the bonding layer 106 described previously. The bonding layer 406 may be formed from a dielectric material, and may be a silicon-containing material such as silicon oxide, SiON, SiN, or the like, or may be another type of dielectric material. The bonding layer 406 may be formed by a deposition process such as CVD, PECVD, PVD, ALD, the like, or a combination thereof. In some embodiments, the bonding layer 406 is formed having a thickness between about 900 nm and about 8000 nm.

Figure 4C:
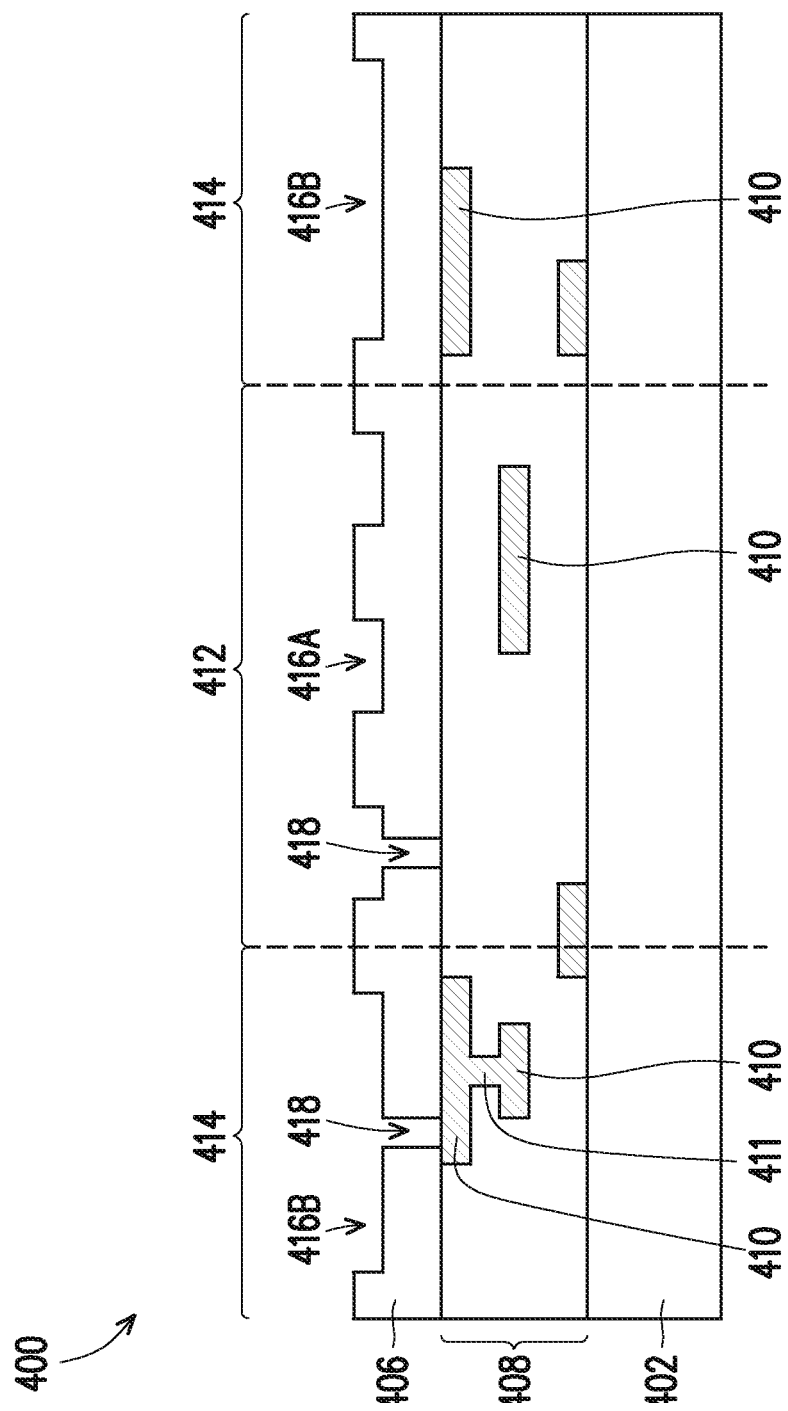

Turning to FIG. 4C, pad openings 416 are formed in the bonding layer 406. Example pad openings 416A and 416B of the pad openings 416 are labeled in FIG. 4C and are described in greater detail below. The pad openings 416 may be formed using acceptable photolithography and etching techniques. In an embodiment, the photolithography process may include forming a photoresist (not shown) over the bonding layer 406, patterning the photoresist with openings corresponding to the pad openings 416, extending the pad openings 416 through the photoresist and into the bonding layer 406, and then removing the photoresist. The photoresist may be a single-layer photoresist, a bi-layer photoresist, a tri-layer photoresist, or the like. The etching process is performed such that the pad openings 416 extend from the top of the bonding layer 406 to an intermediate point of the bonding layer 406. Etching the pad openings 416 to such a depth may be performed using a time-mode, and may be stopped after the etching has been performed for a predetermined period of time. In some embodiments, the bonding layer 406 may include an intermediate etch stop layer that is used to determine the etching depth of the pad openings 416. Other etch and stop point detection techniques are also contemplated.

As shown in FIG. 4C, the pad openings 416 include inner pad openings 416A formed in the inner region 412 and outer pad openings 416B formed in the outer region 414. The inner pad openings 416A correspond to locations where inner bonding pads will be formed, and the outer pad openings 416B correspond to locations where outer bonding structures 420 will be formed, described below. In some embodiments, the outer pad openings 416B may include recesses in which the outer bonding pads 407 are subsequently formed and trenches in which the parallel connections 421 are subsequently formed, described below. Other configurations of outer pad openings 416 are possible. In some embodiments, the inner pad openings 416A may be evenly spaced a distance corresponding to the pitch of the subsequently formed inner bonding pads.

Via openings 418 may be formed in the bonding layer 406, as shown in FIG. 4C. The via openings 418 are formed at the bottom of the pad openings 416, and extend from the bottom of the pad openings 416 to the bottom surface of the bonding layer 406, thereby exposing the metal lines 410. The via openings 418 may be formed using acceptable photolithography and etching techniques. The photolithography process may include forming a photoresist (not shown) over the bonding layer 406 and in the pad openings 416, patterning the photoresist with openings corresponding to the via openings 418, extending the via openings 418 through the photoresist and the bonding layer 406, and then removing the photoresist. The photoresist may be a single-layer photoresist, a bi-layer photoresist, a tri-layer photoresist, or the like. An etch stop layer (not shown) may be formed between the interconnect structure 408 and the bonding layer 406. In such embodiments, the via openings 418 may expose the etch stop layer (not shown) after formation. Portions of the etch stop layer may then be removed in another etching process to expose the metal lines 410 and vias 411 of the interconnect structure 408. The width of the pad openings 416 is greater than the width of the via openings 418.

Figure 4D:
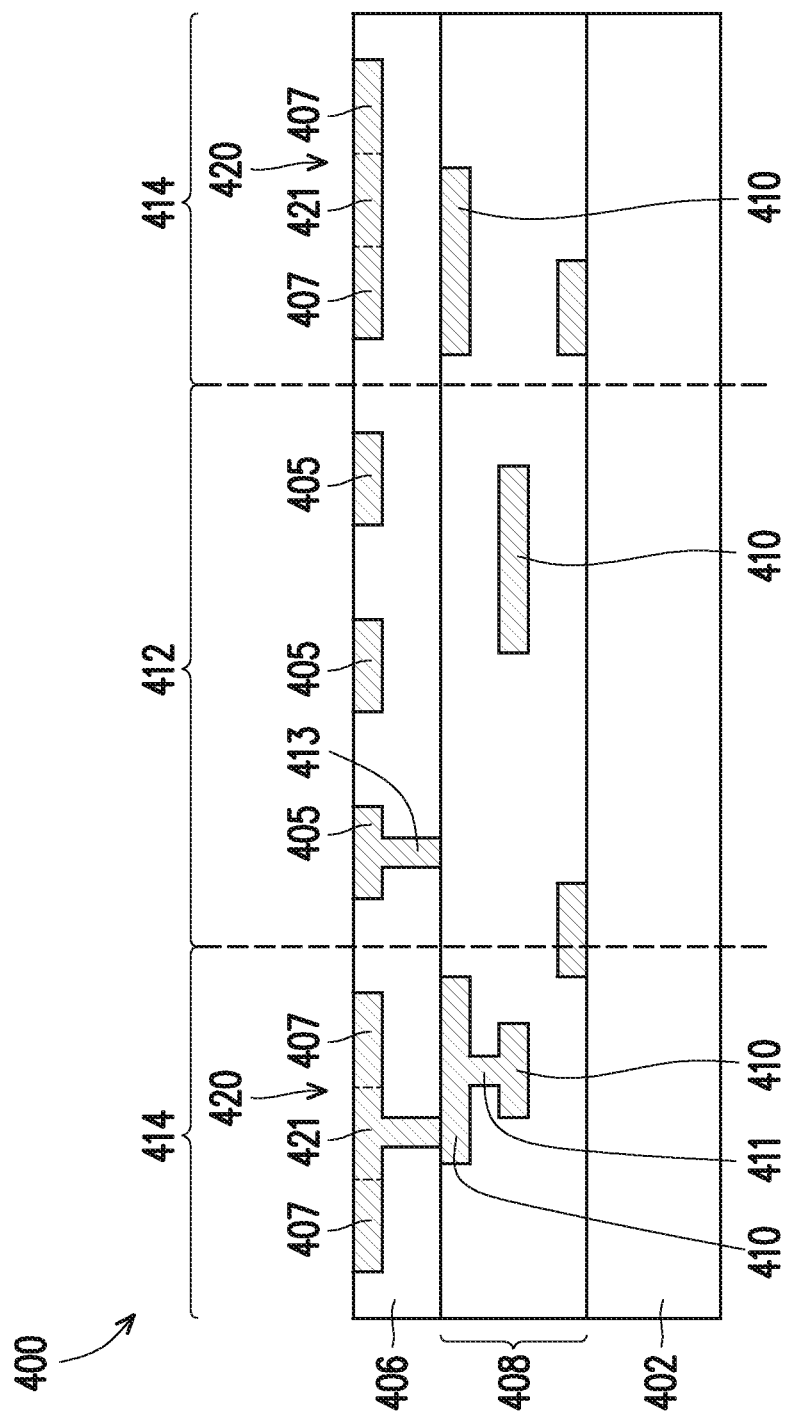

In FIG. 4D, vias 413 are formed in the via openings 418, inner bonding pads 405 are formed in the pad openings 416A, and outer bonding structures 420 are formed in the pad openings 416B. The inner bonding pads 405 may be similar to the inner bonding pads 105 described previously. The outer bonding structures 420 may include outer bonding pads 407 and parallel connections 421, and may be similar to the outer bonding structures 120 described previously. The vias 413, the inner bonding pads 405, or the outer bonding structures 420 may be formed of a conductive material including a metal or a metal alloy such as copper, silver, gold, tungsten, cobalt, aluminum, alloys thereof, or the like. In some embodiments, the formation of the vias 413, the inner bonding pads 405, or the outer bonding structures 420 includes depositing a thin seed layer (not shown) in the pad openings 416 and via openings 418, which may include copper or a copper alloy, and filling the rest of the pad openings 416 and via openings 418 using, for example, ECP or electro-less plating. Excess conductive material and the seed layer may be removed from the top surface of the bonding layer 406 using a planarization process such as a CMP. In some cases, the outer bonding pads 407 having a pitch about the same as that of the inner bonding pads 405 may allow for more uniform planarization across the bonding layer 406. A deposition method may also be contemplated. The inner bonding pads 405 or the outer bonding structures 420 may be electrically connected to the interconnect structure 408 through the vias 413. The process shown in FIGS. 4A-D represents an example process that may be used for forming outer bonding structures 420, and other processes or techniques may be used in other embodiments, such as a damascene process, a dual damascene process, or another process. In some embodiments, the inner bonding pads or outer bonding structures described above with regard to FIGS. 2A-3E or described below with regard to FIGS. 7A-7H may be formed using the process shown in FIGS. 4A-D or formed using a different process.

Figure 5A:
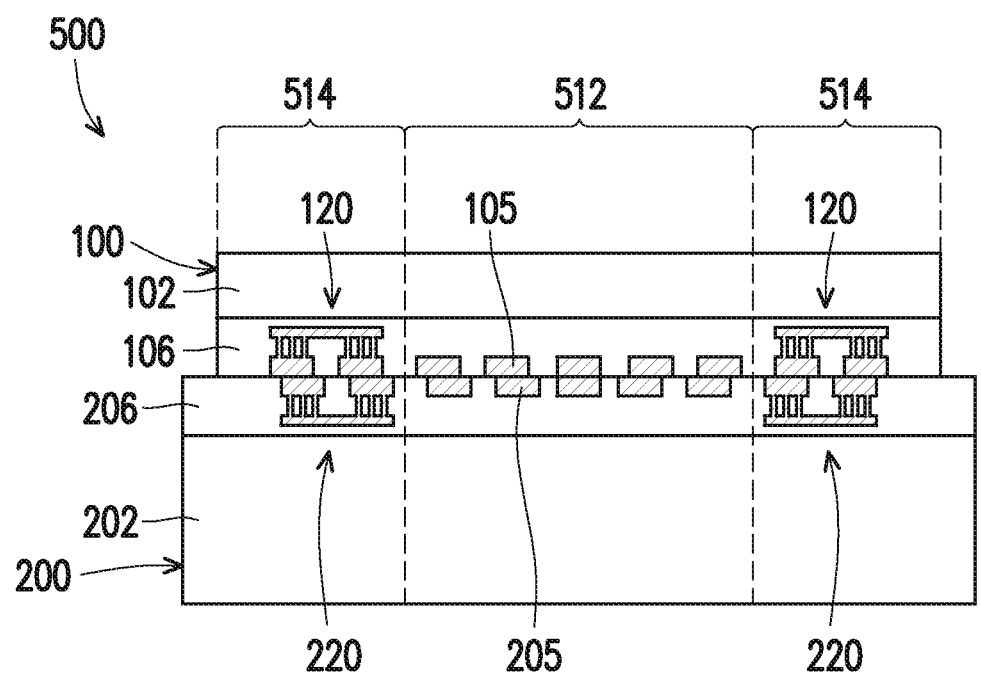
FIGS. 5A-B illustrate a cross-sectional view and a plan view of a semiconductor device with bonding structures in accordance with some embodiments.
Figure 5B:
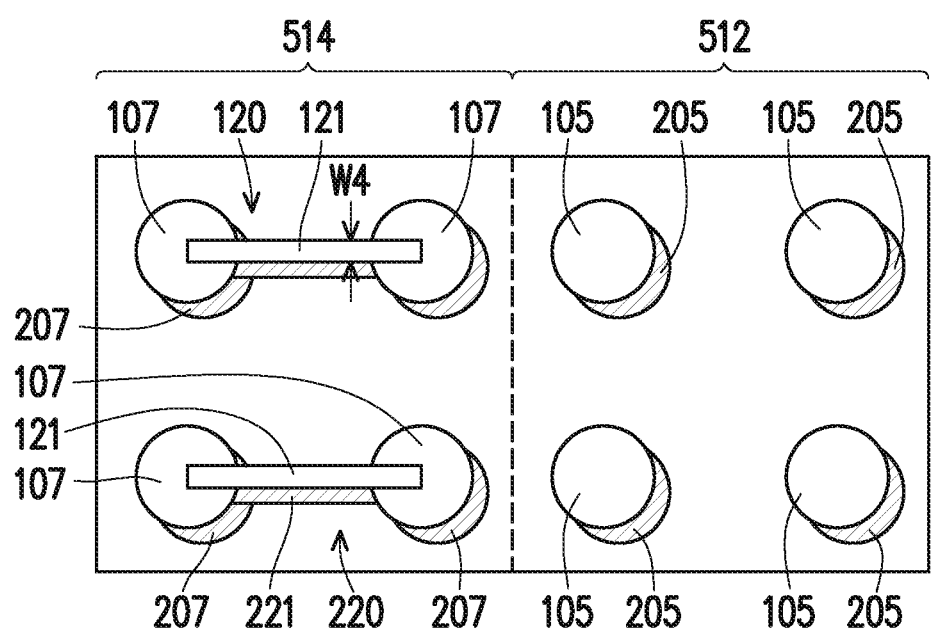

Turning to FIGS. 5A-B, a bonded semiconductor structure 500 is shown according to some embodiments. In the embodiments shown in FIGS. 5A-B, the parallel connections between electrically connected outer bonding pads of the outer bonding structures are formed in a different layer than the outer bonding pads. The bonded semiconductor structure 500 includes a semiconductor device 100 bonded to a wafer 200. The semiconductor device 100 and the wafer 200 may be similar to those described above with respect to FIGS. 2A-B. The bonded semiconductor structure 500 includes an inner region 512 and an outer region 514, which may be similar to the inner region 112 or outer region 114 described previously. In the inner region 512, the semiconductor device 100 and the wafer 200 are electrically connected by the inner bonding pads 105 of the semiconductor device 100 and the inner bonding pads 205 of the wafer 200. In the outer region 514, the semiconductor device 100 and the wafer 200 are electrically connected by the outer bonding structures 120 of the semiconductor device 100 and the outer bonding structures 220 of the wafer 200. FIG. 5A shows a cross-sectional view of the bonded semiconductor structure 500, and FIG. 5B shows a plan view of some embodiments of the bonded semiconductor structure 500. FIGS. 5A-B show the semiconductor device 100 and the wafer 200 as having a misalignment after bonding due to warping of the semiconductor device 100, as described previously.

As shown in FIGS. 5A-B, the outer bonding structure 120 of the semiconductor device 100 includes two outer bonding pads 107 connected by one or more parallel connections 121, and the outer bonding structure 220 of the wafer 200 includes two outer bonding pads 207 connected by one or more parallel connections 221. As shown in FIGS. 5A-B, the parallel connections 121 may be disposed in a different layer than the outer bonding pads 107 and connected to the outer bonding pads 107 by vias, and the parallel connections 221 may be disposed in a different layer than the outer bonding pads 207 and connected to the outer bonding pads 207 by vias. Descriptions of the outer bonding structures 120 of the semiconductor device 100 may also apply to the outer bonding structures 220 of the wafer 200. The outer bonding pads 107 may have the same pitch as the inner bonding pads 105, and the outer bonding pads 207 may have the same pitch as the inner bonding pads 205. The parallel connections 121 (or 221) may have a width W4 that is less than, about equal to, or greater than a dimension of the outer bonding pads 107. For example, FIG. 5B shows parallel connections 121 having a width W4 less than a diameter of the outer bonding pads 107. In some embodiments, parallel connections 121 may have a width W4 between about 500 nm and about 3500 nm or a length L5 between about 7000 nm and about 12000 nm. FIG. 5B shows parallel connections 121 (and parallel connections 221) as having a rectangular shape, but in other embodiments, parallel connections 121 (or 221) may have more than one width W4 along their length or have a different shape such as a curved shape, a trapezoidal shape, a shape with one or more tapering portions, an irregular shape, or another shape. For example, the parallel connections 121 and outer bonding pads 107 may have a configuration or arrangement similar to that described previously with respect to FIGS. 3B-E, except that the parallel connections 121 are disposed in a different layer than the outer bonding pads. In some embodiments, a bonded semiconductor device may include outer bonding structures having parallel connections in the same layer as the outer bonding pads and outer bonding structures having parallel connections in a different layer than the outer bonding pads. In some embodiments, an outer bonding structure may have one or more parallel connections disposed in the same layer as the outer bonding pads and one or more parallel connections disposed in a different layer than the outer bonding pads.

In the embodiment shown in FIGS. 5A-B, the outer bonding pads 107 and the parallel connections 121 are disposed in an outer layer of the bonding layer 106. Top surfaces of the outer bonding pads 107 and the parallel connection 121 are substantially coplanar and include portions not covered by the bonding layer 106. In this manner, the outer bonding pads 107 and the parallel connection 121 may both be used for the outer bonding structure 120 to form electrical connections when the semiconductor device 100 is bonded to the wafer 200. For example, the outer bonding structures 220 of the wafer 200 may include outer bonding pads 207 and parallel connections 221 disposed in an outer layer of the dielectric layer 206 to make electrical connection with the outer bonding structure 120. In some embodiments, an outer bonding structure 120 of the semiconductor device 100 is bonded to a corresponding bonding feature of the wafer 200 (such as an outer bonding structure 220, bonding pad(s), or other type of feature) to form an electrical connection.

By electrically connecting multiple outer bonding pads 107 using parallel connections 121, the contact area of bonded electrical connections may be increased, which may reduce contact resistance of the bonded electrical connections if a misalignment is present. In this manner, contact resistance of the bonded electrical connections due to misalignment may be reduced near the edges of a semiconductor device if a misalignment is present. Additionally, by having the parallel connections 121 disposed in a different layer than the outer bonding pads 107, the pitch and distribution of the outer bonding pads 107 may be similar to the pitch of the inner bonding pads 105, and thus the overall bonding surface of the semiconductor device 100 may have a more uniform distribution of surface features. In some cases, a more uniform distribution of surface features in this manner may allow for a more uniform planarity, for example, after a planarization process, which may allow for improved bonding between surfaces. Thus, the embodiments herein may allow for improved electrical connections between bonded devices without significantly decreasing the bonding quality.

FIGS. 6A-E illustrate cross-sectional views of intermediate stages in the formation of bonding structures in a semiconductor device 600, in accordance with some embodiments. The semiconductor device 600 may be similar to the semiconductor device 100 or wafer 200 described previously. As shown in FIGS. 6A-E, the semiconductor device 600 may have an inner region 612 and an outer region 614, which may be similar to the inner region 112 and the outer region 114 described previously. The semiconductor device 600 includes a substrate 602 on which an interconnect structure 608 is formed. The substrate 602 may be similar to the substrate 102 described previously. The interconnect structure 608 may be similar to the interconnect structure 408 described previously. The interconnect structure 608 may include conductive features such as metal lines 610 or vias 611. In some embodiments, the interconnect structure 608 includes one or more parallel connections 621. The parallel connections 621 may be similar to the parallel connections 121 described previously in FIGS. 5A-B. In some cases, the parallel connections 621 are similar to the metal lines 610.

The metal lines 610, the vias 611, or the parallel connections 621 of the interconnect structure 608 may be formed using techniques similar to those described previously with respect to the interconnect structure 408, such as using a single and/or a dual damascene process. In some cases, the parallel connections 621 may be formed using a different technique than the metal lines 610. In some embodiments, the layer containing the parallel connections 621 is formed having a thickness between about 900 nm and about 1800 nm. In some embodiments, the parallel connections 621 are formed in a different layer of the interconnect structure 608 than shown, and some parallel connections 621 may be formed in different layers than other parallel connections 621.

Figure 6A:
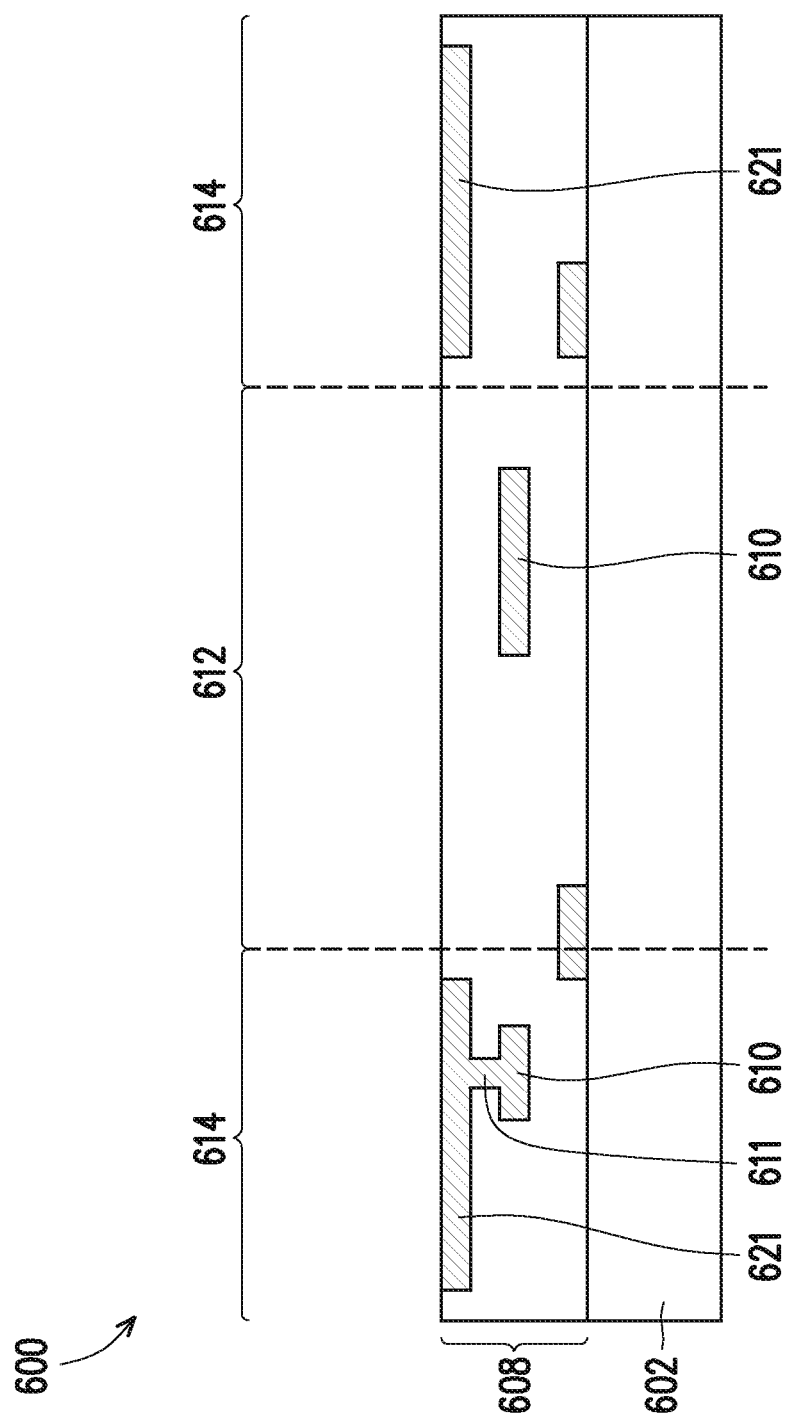
Figure 6C:
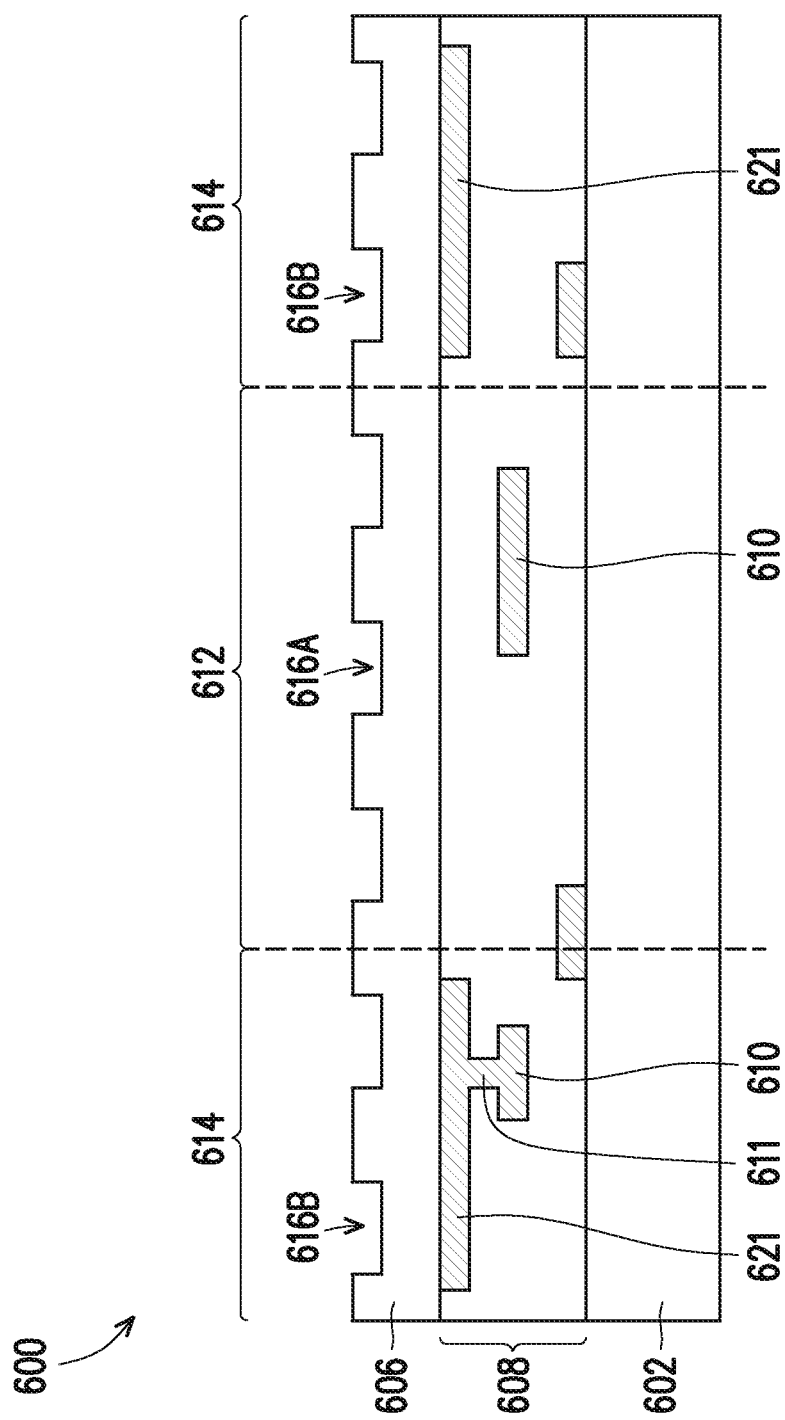

Turning to FIG. 6B, a bonding layer 606 is formed over the interconnect structure 608. The bonding layer 606 may be similar to the bonding layer 106 described previously. In some embodiments, the bonding layer 606 is formed having a thickness between about 900 nm and about 8000 nm. Turning to FIG. 6C, pad openings 616 are formed in the bonding layer 606. Example pad openings 616A and 616B of the pad openings 616 are labeled in FIG. 6C and are described in greater detail below. The pad openings 616 may be formed using techniques similar to those described previously with respect to the pad openings 416. As shown in FIG. 6C, the pad openings 616 include inner pad openings 616A formed in the inner region 612 and outer pad openings 616B formed in the outer region 614. The inner pad openings 616A may be similar to the outer pad openings 616B, and may have a width between about 2000 nm and about 3500 nm in some embodiments. The inner pad openings 616A correspond to locations where inner bonding pads will be formed, and the outer pad openings 616B correspond to locations where outer bonding pads will be formed, described below. The inner pad openings 616A and the outer pad openings 616B may be evenly spaced a distance corresponding to the pitch of the subsequently formed inner bonding pads.

Figure 6D:
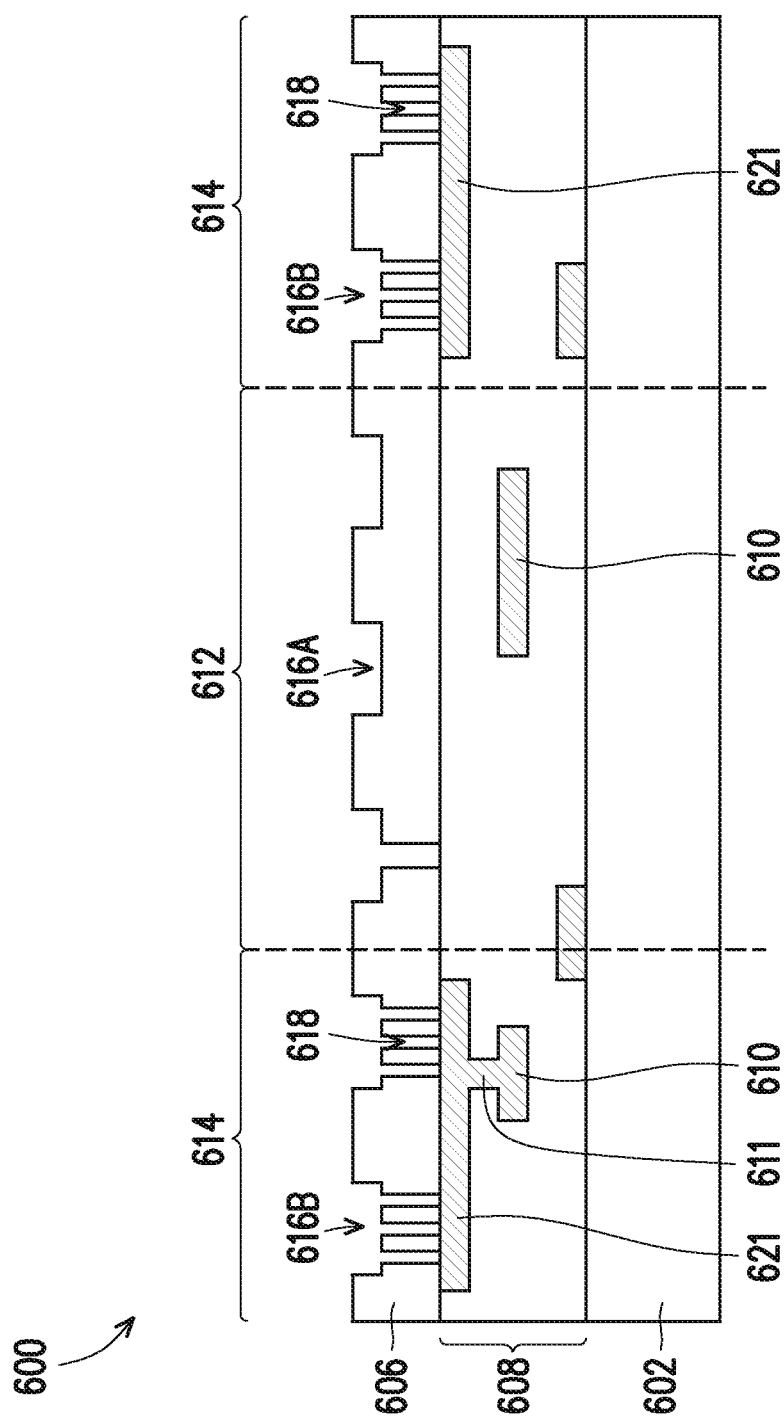

Turning to FIG. 6D, via openings 618 may be formed in the bonding layer 606. The via openings 618 are formed at the bottom of the pad openings 616, and extend from the bottom of the pad openings 616 to the bottom surface of the bonding layer 606, thereby exposing the parallel connections 621 or some of the metal lines 610. The via openings 618 may be formed using techniques similar to those described previously with respect to the via openings 418. Via openings 618 may be formed within inner pad openings 616A or outer pad openings 616B. As an illustrative example, FIG. 6D shows three via openings 618 formed in outer pad openings 616B, but other numbers of via openings 618 may be formed within inner pad openings 616A or outer pad openings 616B. The width of the via openings 618 may be the same or less than the width of the outer pad openings 616B.

Figure 6E:
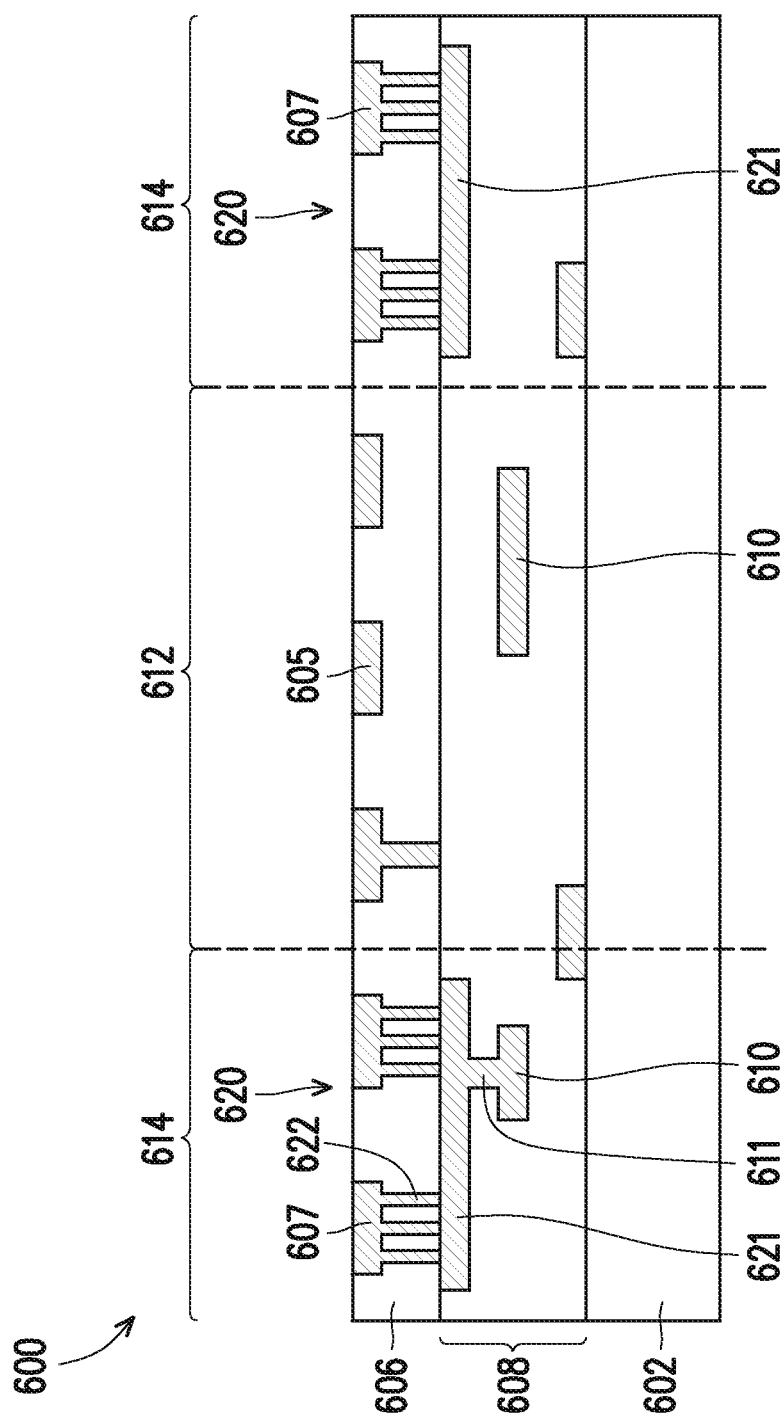

In FIG. 6E, vias 622 are formed in the via openings 618, inner bonding pads 605 are formed in the pad openings 616A, and outer bonding pads 607 are formed in the pad openings 616B. The inner bonding pads 605 may be similar to the inner bonding pads 105 described previously. The outer bonding structures 620 may include outer bonding pads 607, vias 622 and parallel connections 621, and may be similar to the outer bonding structures 120 described previously. The vias 622, the inner bonding pads 605, or the outer bonding pads 607 may be formed using techniques similar to those described previously with respect to FIG. 4D. The vias 622 form electrical connections between the outer bonding pads 607 and the parallel connections 621, or between the inner bonding pads 605 and the interconnect structure 608 (not shown). In some cases, the outer bonding pads 607 having a pitch about the same as that of the inner bonding pads 605 may allow for more uniform planarization across the bonding layer 606. The inner bonding pads 605 or the outer bonding structures 620 may be electrically connected to the interconnect structure 608 through the vias 611. The process shown in FIGS. 6A-E represents an example process that may be used for forming outer bonding structures 620, and other processes or techniques may be used in other embodiments, such as a damascene process, a dual damascene process, or another process. In some embodiments, the inner bonding pads or outer bonding structures described above with regard to FIGS. 2A-3E or described below with regard to FIGS. 7A-7H may be formed using the process shown in FIGS. 6A-E or formed using a different process.

Figure 7A:
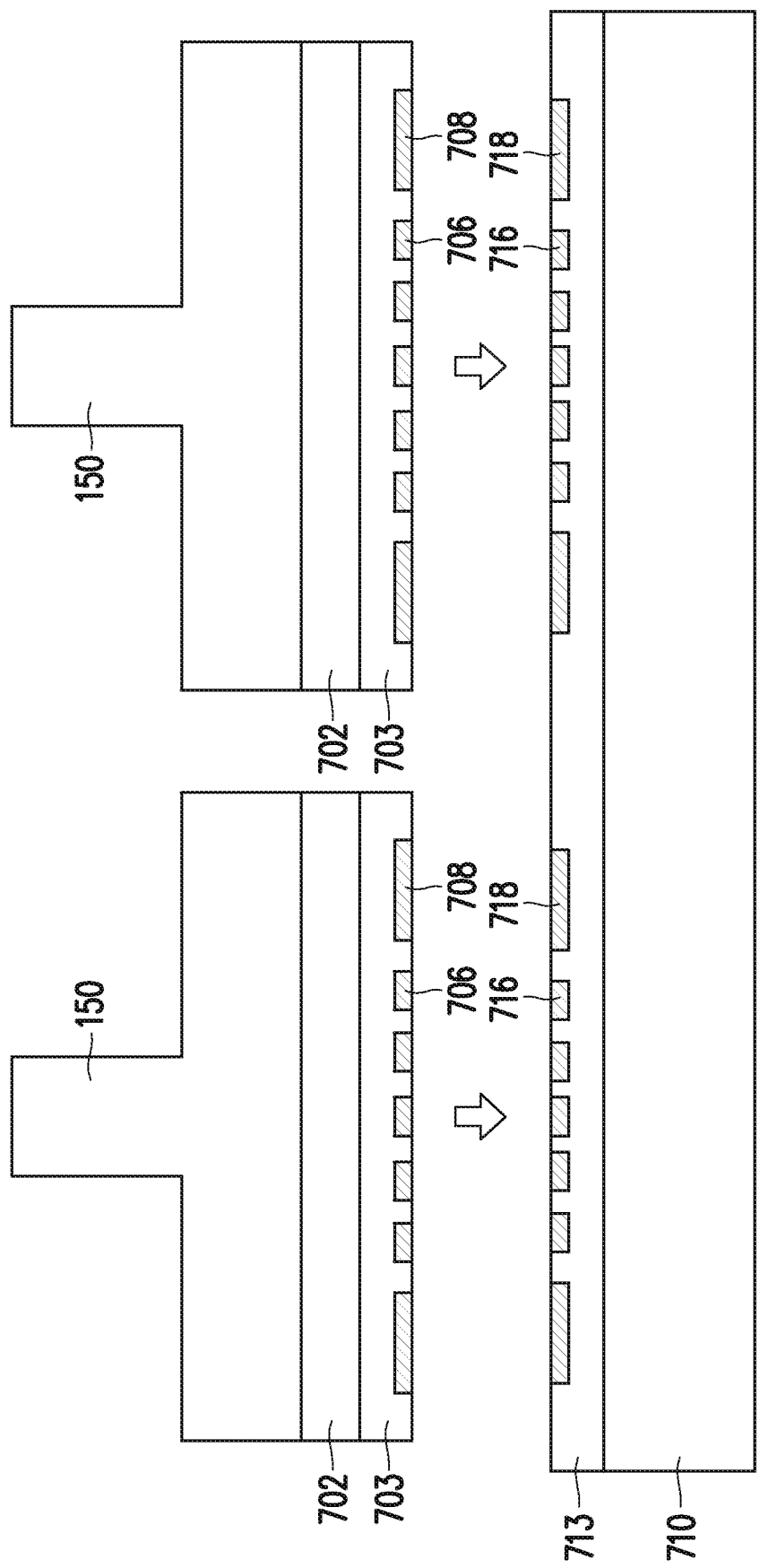
FIGS. 7A-H illustrate cross-sectional views of intermediate steps in a process for forming a package structure in accordance with some embodiments.

FIGS. 7A-H illustrate cross-sectional views of intermediate stages in the formation of a package device 700, in accordance with some embodiments. In some embodiments, package device 700 may be an integrated fan-out (InFO) package. In FIG. 7A, a top device 702 is placed onto a package component 710. The top device 702 may be similar to the semiconductor device 100, and the package component 710 may be similar to wafer 200 described previously, though the top device 702 or the package component 710 may be different in other embodiments. The top device 702 includes inner bonding pads 706 and outer bonding structures 708 at least partially formed in a bonding layer 703 and the package component 710 includes inner bonding pads 716 and outer bonding structures 718 at least partially formed in a bonding layer 713. The bonding layer 703 or the bonding layer 713 may be similar to the bonding layers 106, 406, or 606 described previously. The inner bonding pads 706 or the inner bonding pads 716 may be similar to inner bonding pads 105, 405 or 605 described previously. The outer bonding structures 708 or the outer bonding structures 718 may be similar to outer bonding structures 120, 420, or 620 described previously. The top device 702 may be placed using a pick-and-place process or another process, and may be placed using a bond head 150 in some embodiments. In FIG. 7A, the top device 702 is shown as mounted to a bond head 150, though for clarity the warping of the top device 702 is not shown. The top device 702 may be thinned prior to placement.

Figure 7B:
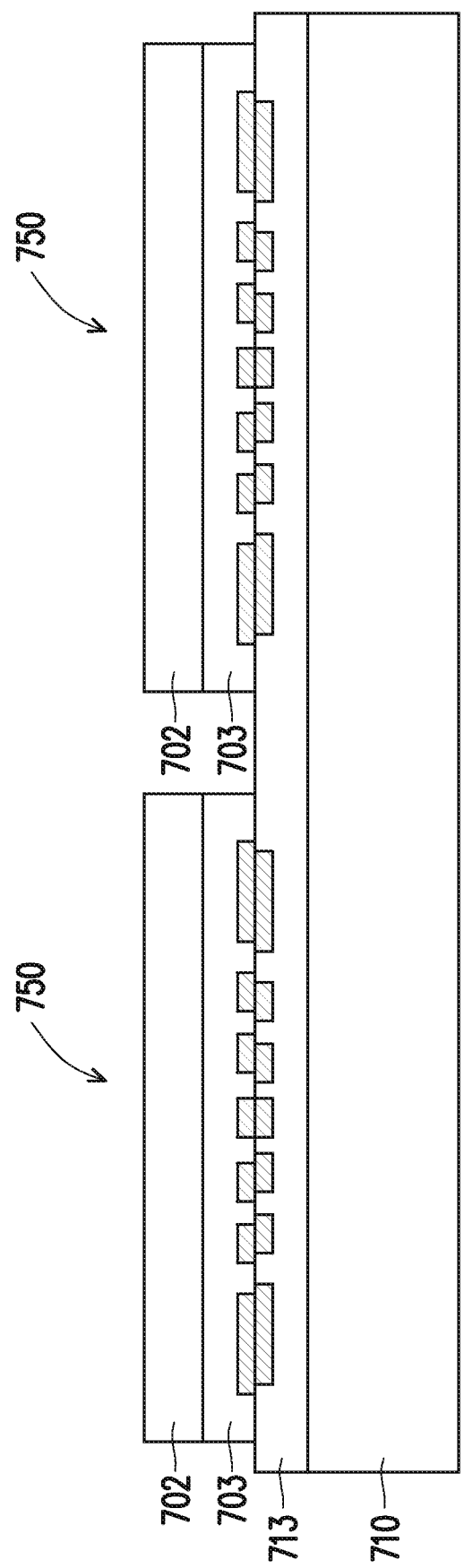

In FIG. 7B, the top device 702 is bonded to the package component 710 using, e.g., direct bonding or hybrid bonding. Before performing the bonding, a surface treatment may be performed on the top device 702 or the package component 710. In some embodiments, the surface treatment includes a plasma treatment. The plasma treatment may be performed in a vacuum environment (e.g., a vacuum chamber, not shown). The process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). The plasma treatment may also be performed using pure or substantially pure $H_2$, Ar, or $N_2$ as the process gas, which treats the surfaces of the inner bonding pads 706 and 716 and the outer bonding structures 708 and 718 and the bonding layers 703 and 713. The top device 702 and package component 710 may be treated with the same surface treatment process, or with different surface treatment processes. In some embodiments, the top device 702 and/or the package component 710 may be cleaned after the surface treatment. Cleaning may include performing a chemical cleaning and a de-ionized water cleaning/rinse.

Next, a pre-bonding process may be performed with the top device 702 and the package component 710. The top device 702 and package component 710 are aligned, with the inner bonding pads 706 of the top device 702 being aligned to the inner bonding pads 716 of the package component 710, and the outer bonding structures 708 of the top device 702 being aligned to the outer bonding structures 718 of the package component 710. After the alignment, the top device 702 and the package component 710 are pressed against each other. The pressing force may be less than about 5 Newtons per die in some embodiments, although a greater or smaller force may also be used. The pre-bonding process may be performed at room temperature (e.g., at a temperature of from about 21° C. to about 25° C.), although higher temperatures may be used. The pre-bonding time may be shorter than about 1 minute, for example.

After the pre-bonding, the bonding layer 703 of the top device 702 and the bonding layer 713 of the package component 710 are bonded to each other. The top device 702 and the package component 710 in combination are referred to as a bonded pair 750 hereinafter. The bond of the bonded pair 750 may be strengthened in a subsequent annealing step. The bonded pair 750 may be annealed at a temperature of from about 300° C. to about 400° C., for example. The annealing may be performed for a period of time of from about 1 hour to about 2 hours, for example. During the annealing, metals in the bonding pads 706 and 716 and in the outer bonding structures 708 and 718 may diffuse to each other so that metal-to-metal bonds are also formed. Hence, the resulting bonds between the top device 702 and the package component 710 may be hybrid bonds.

Figure 7C:
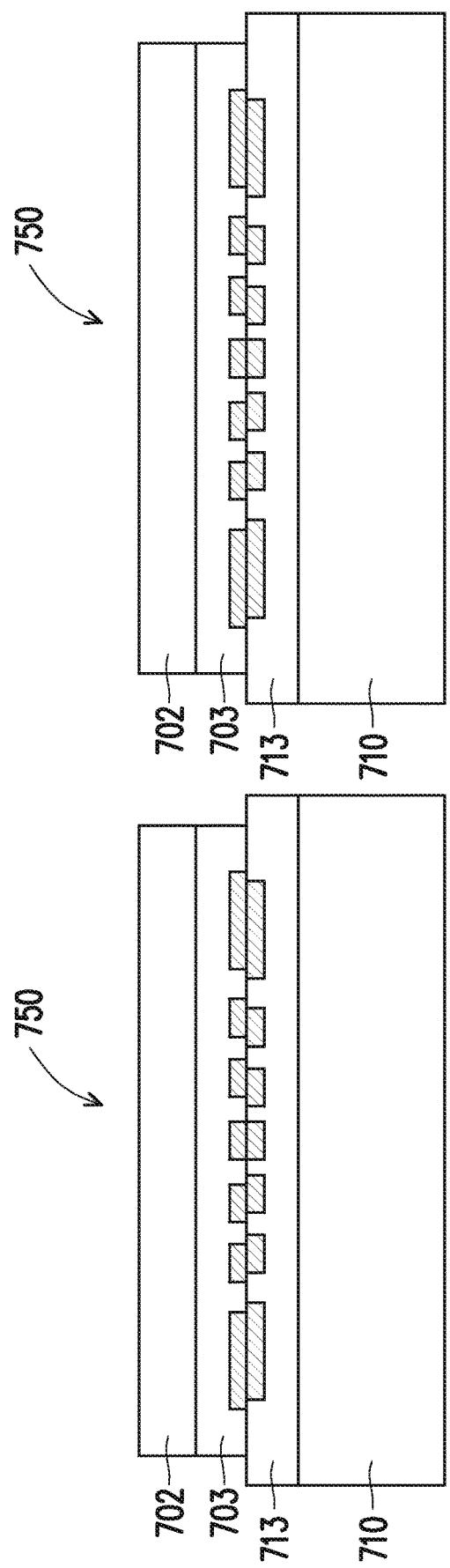

As shown in FIG. 7C, each bonded pair 750 is then singulated. For example, the bonded pairs 750 may be singulated using one or more saw blades. However, any suitable method of singulation, including laser ablation or one or more wet etches, may also be utilized. In some cases, the top device 702 and/or the package component 710 may be thinned prior to singulation.

Figure 7D:
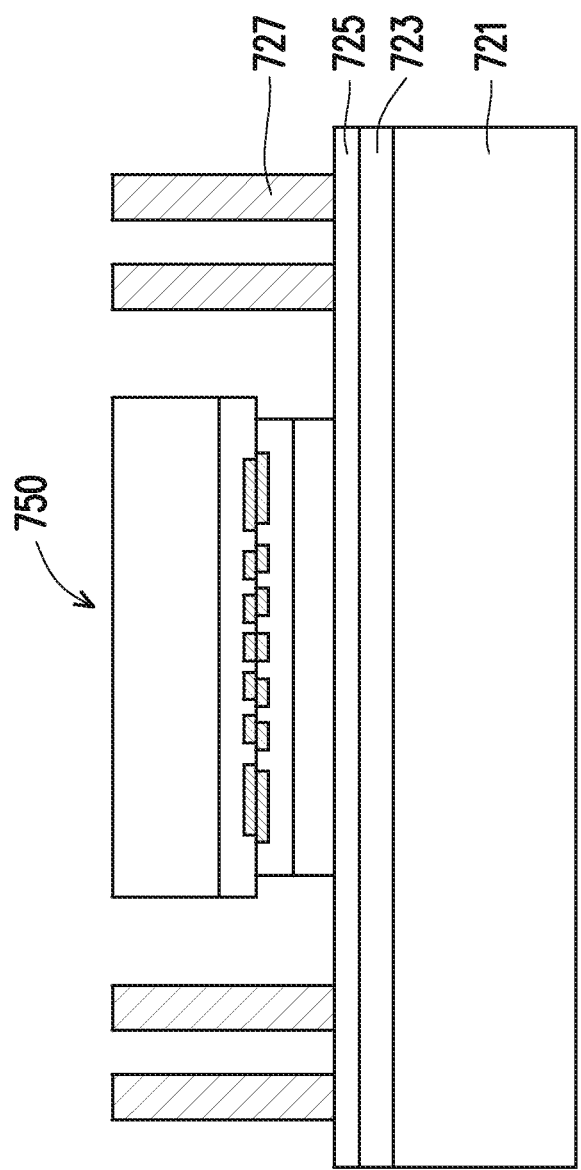

FIG. 7D illustrates a carrier substrate 721 with an adhesive layer 723 and a polymer layer 725 over the adhesive layer 723. In some embodiments, the carrier substrate 721 includes, for example, silicon based materials, such as glass or silicon oxide, or other materials, such as aluminum oxide, combinations of any of these materials, or the like. The carrier substrate 721 may be planar in order to accommodate an attachment of semiconductor devices such as the bonded pair 750. The adhesive layer 723 is placed on the carrier substrate 721 in order to assist in the adherence of overlying structures (e.g., the polymer layer 725). In some embodiments, the adhesive layer 723 may include a light to heat conversion (LTHC) material or an ultra-violet glue which loses its adhesive properties when exposed to ultra-violet light. However, other types of adhesives, such as pressure sensitive adhesives, radiation curable adhesives, epoxies, combinations of these, or the like, may also be used. The adhesive layer 723 may be placed onto the carrier substrate 721 in a semi-liquid or gel form, which is readily deformable under pressure.

The polymer layer 725 is placed over the adhesive layer 723 and is utilized in order to provide protection to, e.g., the bonded pair 750. In some embodiments, the polymer layer 725 may be polybenzoxazole (PBO), although any suitable material, such as polyimide or a polyimide derivative, may alternatively be utilized. The polymer layer 725 may be placed using, e.g., a spin-coating process to a thickness of between about 2 µm and about 15 µm, such as about 5 µm, although any suitable method and thickness may alternatively be used. The bonded pair 750 is attached onto the polymer layer 725. In some embodiments, the bonded pair 750 may be placed using, e.g. a pick-and-place process. However, any suitable method of placing the bonded pair 750 may be utilized.

In some embodiments, through-vias such as through-dielectric vias (TDVs) 727 are formed over the polymer layer 725. In some embodiments, a seed layer (not shown) is first formed over the polymer layer 725. The seed layer is a thin layer of a conductive material that aids in the formation of a thicker layer during subsequent processing steps. In some embodiments, the seed layer may include a layer of titanium about 500 Å thick followed by a layer of copper about 3,000 Å thick. The seed layer may be created using processes such as sputtering, evaporation, or PECVD processes, depending upon the desired materials. Once the seed layer is formed, a photoresist (not shown) may be formed and patterned over the seed layer. The TDVs 727 are then formed within the patterned photoresist. In some embodiments, the TDVs 727 include one or more conductive materials, such as copper, tungsten, other conductive metals, or the like, and may be formed, for example, by electroplating, electroless plating, or the like. In some embodiments, an electroplating process is used wherein the seed layer and the photoresist are submerged or immersed in an electroplating solution. Once the TDVs 727 have been formed using the photoresist and the seed layer, the photoresist may be removed using a suitable removal process. In some embodiments, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer. Once the TDVs 727 have been formed, exposed portions of the seed layer are then removed, for example, using a wet or dry etching process. The TDVs 727 may be formed to a height of between about 180 µm and about 200 µm, with a critical dimension of about 190 µm and a pitch of about 300 µm.

Figure 7E:
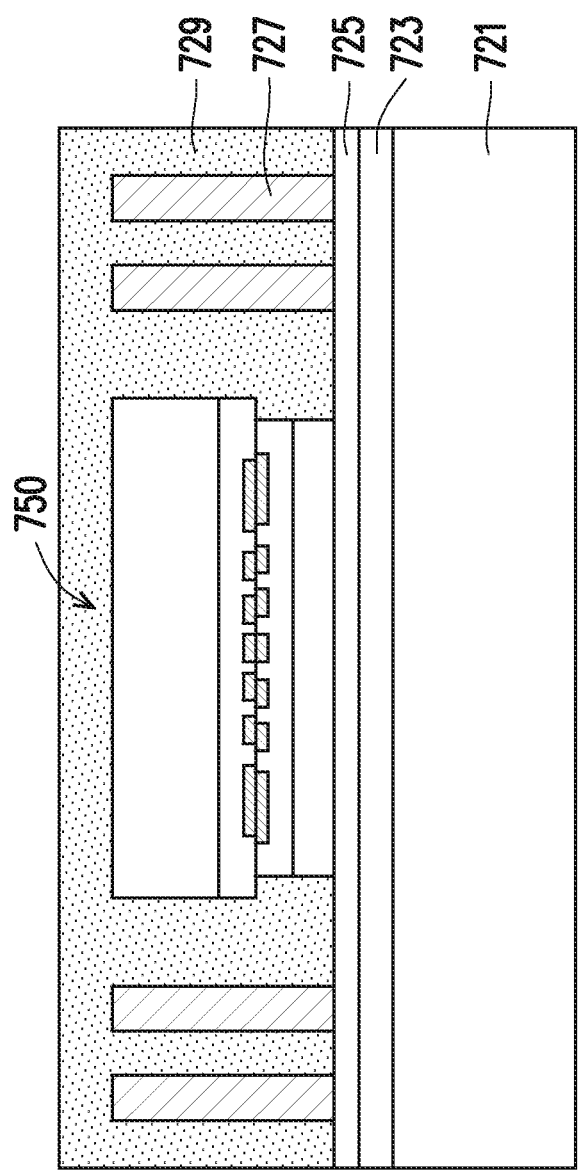
Figure 7F:
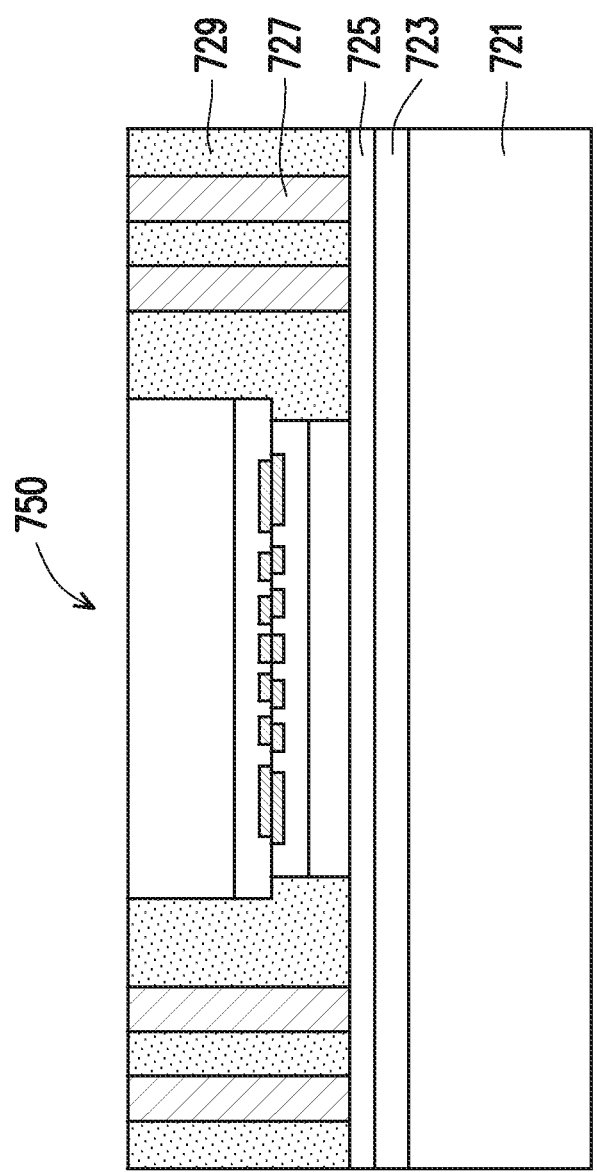

FIG. 7E illustrates an encapsulation of the bonded pair 750 and the TDVs 727 with an encapsulant 729. The encapsulant 729 may be a molding compound such as a resin, polyimide, PPS, PEEK, PES, a heat resistant crystal resin, combinations of these, or the like. FIG. 7F illustrates a thinning of the encapsulant 729 in order to expose the TDVs 727 and the bonded pair 750. The thinning may be performed, e.g., using a CMP process or another process.

Figure 7G:
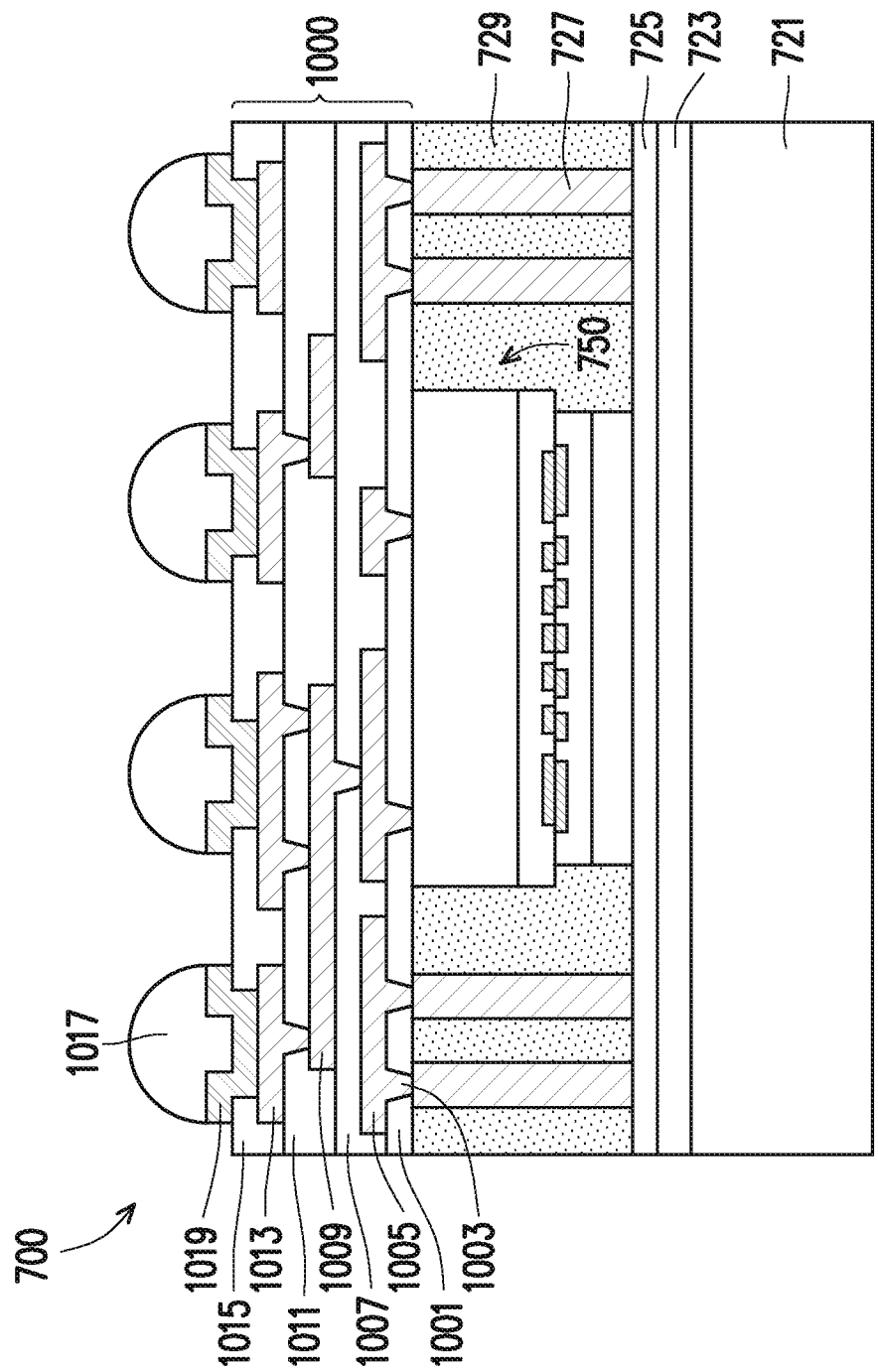

FIG. 7G illustrates a formation of a redistribution structure 1000 with one or more layers over the encapsulant 729.

In some embodiments, the redistribution structure 1000 may be formed by initially forming a first redistribution passivation layer 1001 over the encapsulant 729. In some embodiments, the first redistribution passivation layer 1001 may be polybenzoxazole (PBO), although any suitable material, such as polyimide or a polyimide derivative, such as a low temperature cured polyimide, may alternatively be utilized. The first redistribution passivation layer 1001 may be placed using, e.g., a spin-coating process to a thickness of between about 5 µm and about 17 µm, such as about 7 µm, although any suitable method and thickness may alternatively be used.

Once the first redistribution passivation layer 1001 has been formed, first redistribution vias 1003 may be formed through the first redistribution passivation layer 1001 in order to make electrical connections to the bonded pair 750 and the TDVs 727. In some embodiments the first redistribution vias 1003 may be formed by using a damascene process, a dual damascene process, or another process. After the first redistribution vias 1003 have been formed, a first redistribution layer 1005 is formed over and in electrical connection with the first redistribution vias 1003. In some embodiments the first redistribution layer 1005 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 1005 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 4 µm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 1005.

After the first redistribution layer 1005 has been formed, a second redistribution passivation layer 1007 may be formed and patterned to help isolate the first redistribution layer 1005. In some embodiments the second redistribution passivation layer 1007 may be similar to the first redistribution passivation layer 1001, such as by being a positive tone PBO, or may be different from the first redistribution passivation layer 1001, such as by being a negative tone material such as a low-temperature cured polyimide. The second redistribution passivation layer 1007 may be placed to a thickness of about 7 µm. Once in place, the second redistribution passivation layer 1007 may be patterned to form openings using, e.g., a photolithographic masking and etching process or, if the material of the second redistribution passivation layer 1007 is photosensitive, exposing and developing the material of the second redistribution passivation layer 1007. However, any suitable material and method of patterning may be utilized.

After the second redistribution passivation layer 1007 has been patterned, a second redistribution layer 1009 may be formed to extend through the openings formed within the second redistribution passivation layer 1007 and make electrical connection with the first redistribution layer 1005. In some embodiments the second redistribution layer 1009 may be formed using materials and processes similar to the first redistribution layer 1005. For example, a seed layer may be applied and covered by a patterned photoresist, a conductive material such as copper may be applied onto the seed layer, the patterned photoresist may be removed, and the seed layer may be etched using the conductive material as a mask. In some embodiments the second redistribution layer 1009 is formed to a thickness of about 4 μm. However, any suitable material or process of manufacture may be used.

After the second redistribution layer 1009 has been formed, a third redistribution passivation layer 1011 is applied over the second redistribution layer 1009 in order to help isolate and protect the second redistribution layer 1009. In some embodiments the third redistribution passivation layer 1011 may be formed of similar materials and in a similar fashion as the second redistribution passivation layer 1007 to a thickness of about 7 μm. For example, the third redistribution passivation layer 1011 may be formed of PBO or a low-temperature cured polyimide that has been applied and patterned as described above with respect to the second redistribution passivation layer 1007. However, any suitable material or process of manufacture may be utilized.

After the third redistribution passivation layer 1011 has been patterned, a third redistribution layer 1013 may be formed to extend through the openings formed within the third redistribution passivation layer 1011 and make electrical connection with the second redistribution layer 1009. In some embodiments the third redistribution layer 1013 may be formed using materials and processes similar to the first redistribution layer 1005. For example, a seed layer may be applied and covered by a patterned photoresist, a conductive material such as copper may be applied onto the seed layer, the patterned photoresist may be removed, and the seed layer may be etched using the conductive material as a mask. In some embodiments the third redistribution layer 1013 is formed to a thickness of 5 μm. However, any suitable material or process of manufacture may be used.

After the third redistribution layer 1013 has been formed, a fourth redistribution passivation layer 1015 may be formed over the third redistribution layer 1013 in order to help isolate and protect the third redistribution layer 1013. In some embodiments the fourth redistribution passivation layer 1015 may be formed of similar materials and in a similar fashion as the second redistribution passivation layer 1007. For example, the fourth redistribution passivation layer 1015 may be formed of PBO or a low-temperature cured polyimide that has been applied and patterned as described above with respect to the second redistribution passivation layer 1007. In some embodiments the fourth redistribution passivation layer 1015 is formed to a thickness of about 8 μm. However, any suitable material or process of manufacture may be utilized.

In other embodiments, the redistribution vias and redistribution layers of the redistribution structure 1000 may be formed using a damascene process, such as a dual-damascene process. For example, a first redistribution passivation layer may be formed over the encapsulant 729. The first redistribution passivation layer is then patterned using one or more photolithographic steps to form both openings for vias and openings for conductive lines within the first redistribution passivation layer. A conductive material may be formed in the openings for vias and the openings for conductive lines to form the first redistribution vias and the first redistribution layer. Additional redistribution passivation layers may be formed over the first redistribution passivation layer, and additional sets of redistribution vias and conductive lines may be formed in the additional redistribution passivation layers as described for the first redistribution passivation layer, forming the redistribution structure 1000. This or other techniques may be used to form the redistribution structure 1000.

FIG. 7G additionally illustrates a formation of underbump metallizations 1019 and third external connectors 1017 to make electrical contact with the third redistribution layer 1013. In some embodiments the underbump metallizations 1019 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 1019. Any suitable materials or layers of material that may be used for the underbump metallizations 1019 are fully intended to be included within the scope of the embodiments.

In some embodiments, the underbump metallizations 1019 are created by forming each layer over the third redistribution layer 1013 and along the interior of the openings through the fourth redistribution passivation layer 1015. The forming of each layer may be performed using a plating process, such as electrochemical plating, although other processes of formation, such as sputtering, evaporation, or PECVD process, may be used depending upon the desired materials. The underbump metallizations 1019 may be formed to have a thickness of between about 0.7 μm and about 10 μm, such as about 5 μm.

In some embodiments the third external connectors 1017 may be placed on the underbump metallizations 1019 and may be a ball grid array (BGA) which comprises a eutectic material such as solder, although any suitable materials may alternatively be used. In some embodiments in which the third external connectors 1017 are solder balls, the third external connectors 1017 may be formed using a ball drop method, such as a direct ball drop process. In another embodiment, the solder balls may be formed by initially forming a layer of tin through any suitable method such as evaporation, electroplating, printing, solder transfer, and then performing a reflow in order to shape the material into the desired bump shape. Once the third external connectors 1017 have been formed, a test may be performed to ensure that the structure is suitable for further processing.

The polymer layer 725 is then patterned in order to expose the TDVs 727. In some embodiments the polymer layer 725 may be patterned using, e.g., a laser drilling method. In such a method a protective layer, such as a light-to-heat conversion (LTHC) layer or a hogomax layer (not separately illustrated in FIG. 7G) is first deposited over the polymer layer 725. Once protected, a laser is directed towards those portions of the polymer layer 725 which are desired to be removed in order to expose the underlying TDVs 727. During the laser drilling process the drill energy may be in a range from 0.1 mJ to about 30 mJ, and a drill angle of about 0 degree (perpendicular to the polymer layer 725) to about 85 degrees to normal of the polymer layer 725. In some embodiments the patterning may be formed to form openings over the TDVs 727 to have a width of between about 100 μm and about 300 μm, such as about 200 μm.

In another embodiment, the polymer layer 725 may be patterned by initially applying a photoresist (not individually illustrated in FIG. 7G) to the polymer layer 725 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 725 are removed with, e.g., a dry etch process. However, any other suitable method for patterning the polymer layer 725 may be utilized.

Figure 7H:
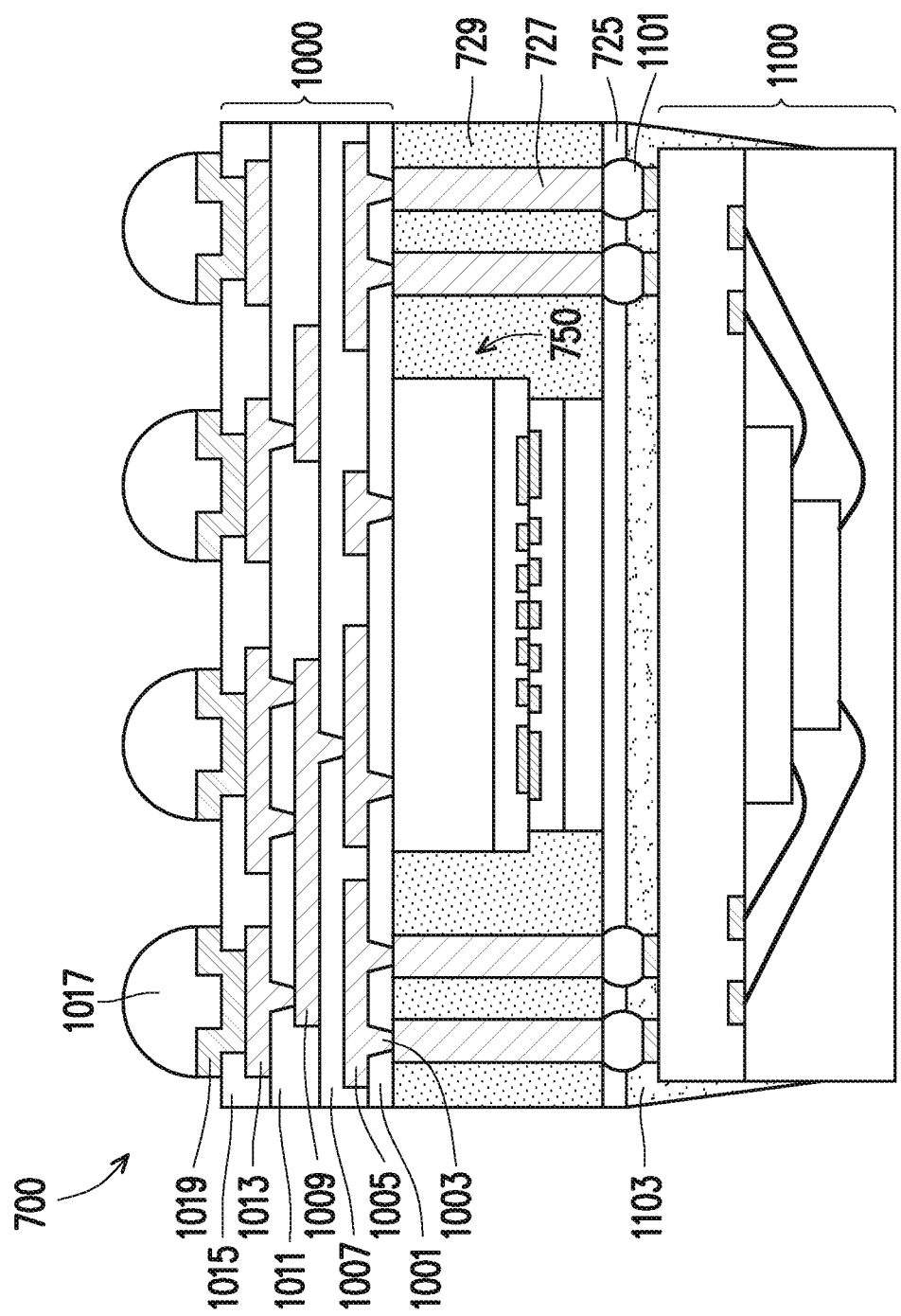

FIG. 7H illustrates a bonding of a package 1100 to the TDVs 727 through the polymer layer 725. Prior to bonding the package 1100, the carrier substrate 721 and the adhesive layer 723 are removed from the polymer layer 725. The polymer layer 725 is also patterned to expose the TDVs 727. In some embodiments, the package 1100 may include additional substrates, additional semiconductor devices, internal connections, interposers, etc. The additional semiconductor devices may include one or more semiconductor devices designed for an intended purpose such as being a memory die (e.g., a DRAM die), a logic die, a central processing unit (CPU) die, combinations of these, or the like. In some embodiments, one or more additional semiconductor devices includes integrated circuit devices, such as transistors, capacitors, inductors, resistors, first metallization layers (not shown), and the like, therein, as desired for a particular functionality. In some embodiments, one or more of the additional semiconductor devices are designed and manufactured to work in conjunction with or concurrently with the bonded pair 750. An encapsulant 1103 may be used to encapsulate and protect the package 1100.

In some embodiments, external connections 1101 may be formed to provide an external connection between the package 1100 and, e.g., the TDVs 727. The external connections 1101 may be contact bumps such as microbumps or controlled collapse chip connection (C4) bumps and may comprise a material such as tin, or other suitable materials, such as silver or copper. In some embodiments in which the external connections 1101 are tin solder bumps, the external connections 1101 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the external connections 1101 have been formed, the external connections 1101 are aligned with and placed over the TDVs 727, and a bonding is performed. For example, in some embodiments in which the external connections 1101 are solder bumps, the bonding process may comprise a reflow process whereby the temperature of the fourth external connections 1101 is raised to a point where the external connections 1101 will liquefy and flow, thereby bonding the package 1100 to the TDVs 727 once the external connections 1101 resolidify.

Embodiments may achieve advantages. In some embodiments, bonding pads near the edge of a device are connected in parallel. By using multiple connected bonding pads for a single electrical connection, the available bonding area of the electrical connection is increased. The increased bonding area can reduce contact resistance due to misalignment of the bonding pads or warping of the device during a bonding process. Additionally, the connected bonding pads may be formed having the same pitch as other unconnected bonding pads, such as those near the center of the device. By maintaining a constant pitch for bonding pads formed on the device, greater process uniformity may be achieved. For example, a more uniform bonding pad pitch may produce a more planar surface after a planarization process. In some embodiments, the connected bonding pads may be used for power or ground electrical connections between bonded devices.

In an embodiment, a semiconductor device includes a first interconnect structure over first substrate, a first bonding layer over the first interconnect structure, multiple first bonding pads disposed in a first region of the first bonding layer, the first bonding pads having a first pitch, and multiple second bonding pads disposed in a second region of the first bonding layer, the second region extending between a first edge of the first bonding layer and the first region, the second bonding pads having the first pitch, the multiple second bonding pads including multiple pairs of adjacent second bonding pads, wherein the second bonding pads of each respective pair are connected by a first metal line. In an embodiment, the first metal lines are disposed in the same layer as the second bonding pads. In an embodiment, the first metal lines are disposed in the interconnect structure and connected to the second bonding pads of each respective pair by vias disposed in the bonding layer. In an embodiment, the semiconductor device includes a second bonding layer over a second substrate and multiple third bonding pads disposed in the second bonding layer, including multiple pairs of adjacent third bonding pads, wherein the third bonding pads of each respective pair are connected by a second metal line, and wherein the third bonding pads are bonded to the second bonding pads. In an embodiment, the third bonding pads have a pitch that is less than that of the second bonding pads. In an embodiment, the second region extends between a second edge of the first bonding layer and the first region. In an embodiment, pairs of adjacent second bonding pads proximal the first edge have an orientation that is perpendicular to pairs of adjacent second bonding pads proximal the second edge. In an embodiment, the second region extends a distance from the first edge of the bonding layer that is about 10% of the distance from the first edge of the bonding layer to the opposite edge of the bonding layer. In an embodiment, the second region extends a first distance from the first edge of the bonding layer and a second distance from a second edge of the bonding layer, the first distance different than the second distance.

In an embodiment, a method includes depositing a dielectric layer over a semiconductor substrate, etching multiple bond pad openings in the dielectric layer, the bond pad openings having a first pitch, etching multiple second openings in the dielectric layer, the second openings extending between respective first bond pad openings and second bond pad openings of the multiple bond pad openings, wherein the first bond pad openings are adjacent one or more sidewalls of the semiconductor substrate, depositing conductive material within the multiple bond pad openings and within the multiple second openings, and removing excess conductive material using a planarization process. In an embodiment, the bond pad openings have a first diameter, and wherein the second openings have a width about equal to the first diameter. In an embodiment, the method includes etching multiple third openings in the dielectric layer, the third openings extending from bottom surfaces of the bond pad openings to a bottom surface of the dielectric layer, and further including depositing the conductive material within the third openings. In an embodiment, the method further includes forming multiple inter-layer dielectric (ILD) layers over the semiconductor substrate, wherein the dielectric layer is formed over the plurality of ILD layers. In an embodiment, the method further includes bonding the dielectric layer to a device substrate including bonding pads and bonding the conductive material to the bonding pads of the device substrate. In an embodiment, the orientation of a second opening between a first bond pad and a second bond pad is based on the location of the first bond pad.

In an embodiment, a method includes forming a first semiconductor device that includes forming an interconnect structure on a first substrate, forming a first bonding layer on the interconnect structure, and forming first bonding pads in the first bonding layer, wherein first multiple first bonding pads include sets of adjacent first bonding pads connected in parallel by multiple first conductive lines, forming a second semiconductor device that includes forming a second bonding layer on a second substrate, and forming second bonding pads in the second bonding layer, wherein first multiple second bonding pads include sets of adjacent second bonding pads connected in parallel by multiple second conductive lines, and bonding the first bonding layer to the second bonding layer, including bonding the first multiple first bonding pads to the first multiple second bonding pads. In an embodiment, the method includes forming the multiple first conductive lines within the interconnect structure. In an embodiment, the method further includes forming the multiple first conductive lines within the first bonding layer. In an embodiment, the first bonding pads have a different pitch than the second bonding pads. In an embodiment, the first multiple first bonding pads are disposed adjacent an edge of the first bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a dielectric layer over a semiconductor substrate;
   etching first bond pad openings and second bond pad openings in the dielectric layer, wherein the first bond pad openings are adjacent one or more sidewalls of the semiconductor substrate, wherein each second bond pad opening is adjacent at least one first bond pad opening;
   etching trenches in the dielectric layer, each trench extending from at least one first bond pad opening to at least one second bond pad opening;
   depositing conductive material within the first bond pad openings to form first bond pads comprising the deposited conductive material, within the second bond pad openings to form second bond pads comprising the deposited conductive material, and within the trenches, wherein the deposited conductive material within the trenches electrically connects the first bond pads to the second bond pads; and
   removing excess conductive material using a planarization process.

2. The method of claim 1, wherein the first bond pad openings have a first diameter, and wherein the trenches have a width equal to the first diameter.

3. The method of claim 1, further comprising etching third openings in the dielectric layer, the third openings extending from bottom surfaces of the first bond pad openings to a bottom surface of the dielectric layer, and further comprising depositing the conductive material within the third openings.

4. The method of claim 1, further comprising forming a plurality of inter-layer dielectric (ILD) layers over the semiconductor substrate, wherein the dielectric layer is formed over the plurality of ILD layers.

5. The method of claim 1, further comprising bonding the dielectric layer to a device substrate comprising third bonding pads and bonding the conductive material to the third bonding pads of the device substrate.

6. The method of claim 1, wherein the orientation of a trench between a first bond pad and a second bond pad is based on the location of the first bond pad.

7. A method comprising:
   forming a first semiconductor device comprising:
      forming an interconnect structure on a first substrate;
      forming a first bonding layer on the interconnect structure;
      forming a plurality of first conductive lines in the first bonding layer; and
      forming first bonding pads in the first bonding layer, wherein a first plurality of the first bonding pads comprises sets of adjacent first bonding pads connected in parallel by first conductive lines of the plurality of first conductive lines;
   forming a second semiconductor device comprising:
      forming a second bonding layer on a second substrate; and
      forming second bonding pads in the second bonding layer, wherein a first plurality of the second bonding pads comprise sets of adjacent second bonding pads connected in parallel by a plurality of second conductive lines, wherein the second bonding pads have a different pitch than the first bonding pads; and
   bonding the first bonding layer to the second bonding layer, comprising bonding the first plurality of first bonding pads to the first plurality of second bonding pads.

8. The method of claim 7, further comprising forming a plurality of third conductive lines within the interconnect structure, wherein the sets of adjacent first bonding pads of the first plurality of the first bonding pads are connected in parallel by third conductive lines of the plurality of third conductive lines.

9. The method of claim 7, wherein the first plurality of the first bonding pads is disposed adjacent an edge of the first bonding layer.

10. The method of claim 7, wherein a first set of adjacent first bonding pads of the first plurality of the first bonding pads is connected in parallel by at least two first conductive lines of the plurality of first conductive lines.

11. The method of claim 7, wherein top surfaces of the first conductive lines of the plurality of first conductive lines and top surfaces of the first bonding pads of the first plurality of first bonding pads are level.

12. A method comprising:
   depositing a first bonding layer over a first substrate;
   forming a plurality of first bonding pads in a first region of the first bonding layer, wherein the first bonding pads have a first pitch; and
   forming a plurality of second bonding pads in a second region of the first bonding layer, wherein the second region extends from a first edge of the first bonding layer to the first region, wherein the second bonding pads of the plurality of second bonding pads have the first pitch, wherein the plurality of second bonding pads comprise a plurality of pairs of adjacent second bonding pads, wherein the second bonding pads of each respective pair are connected by a respective first metal line, wherein each respective first metal line is within the first bonding layer, wherein a width of the first metal lines is less than a width of the second bonding pads of the plurality of second bonding pads.

13. The method of claim 12, wherein a first pair of adjacent second bonding pads is oriented perpendicularly to a second pair of adjacent second bonding pads.

14. The method of claim 12 further comprising:
depositing a second bonding layer over a second substrate;
forming a plurality of third bonding pads in the second bonding layer, wherein the plurality of third bonding pads comprises a plurality of pairs of adjacent third bonding pads, wherein the third bonding pads of each respective pair are connected by a respective second metal line; and
bonding the third bonding pads to the second bonding pads.

15. The method of claim 14, wherein the third bonding pads have a pitch that is less than that of the second bonding pads.

16. The method of claim 12, wherein the second region extends between a second edge of the first bonding layer and the first region.

17. The method of claim 16, wherein pairs of adjacent second bonding pads proximal the first edge have an orientation that is perpendicular to pairs of adjacent second bonding pads proximal the second edge.

18. The method of claim 12, wherein the second region extends a distance from the first edge of the bonding layer that is about 10% of the distance from the first edge of the bonding layer to a second edge of the bonding layer that is opposite the first edge of the bonding layer.

19. The method of claim 12, wherein the second region extends a first distance from the first edge of the bonding layer and a second distance from a second edge of the bonding layer, the first distance different than the second distance.

20. The method of claim 12, wherein each first metal line connecting a respective pair of second bonding pads is laterally adjacent the second bonding pads of the respective pair of second bonding pads.

* * * * *